(12) United States Patent
Woo et al.

(10) Patent No.: US 12,184,807 B2
(45) Date of Patent: Dec. 31, 2024

(54) ELECTRONIC DEVICE FOR PROVIDING CAMERA PREVIEW IMAGE AND OPERATING METHOD THEREOF

(71) Applicant: SAMSUNG ELECTRONICS CO., LTD., Suwon-si (KR)

(72) Inventors: Kwangtaek Woo, Suwon-si (KR); Deukkyu Oh, Suwon-si (KR); Changho Lee, Suwon-si (KR); Byoungkug Kim, Suwon-si (KR); Jongwoon Jang, Suwon-si (KR); Sungjun Kim, Suwon-si (KR); Jinwan An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 17/584,965

(22) Filed: Jan. 26, 2022

(65) Prior Publication Data
US 2022/0150345 A1 May 12, 2022

Related U.S. Application Data

(63) Continuation of application No. PCT/KR2020/010497, filed on Aug. 7, 2020.

(30) Foreign Application Priority Data

Aug. 7, 2019 (KR) .................. 10-2019-0096299

(51) Int. Cl.
*H04M 1/72403* (2021.01)
*H04M 1/02* (2006.01)
(Continued)

(52) U.S. Cl.
CPC ..... *H04M 1/72403* (2021.01); *H04M 1/0216* (2013.01); *H04N 23/632* (2023.01);
(Continued)

(58) Field of Classification Search
CPC ........... H04M 1/72403; H04M 1/0216; H04M 2201/38; H04M 1/0214; H04M 2250/52;
(Continued)

(56) References Cited

U.S. PATENT DOCUMENTS 9,386,300 B2 7/2016 Lee et al.
10,506,153 B2 12/2019 Kang et al.
(Continued)

FOREIGN PATENT DOCUMENTS

JP 2012-159616 8/2012
JP 2013-106170 5/2013
(Continued)

OTHER PUBLICATIONS

Extended European Search Report for EP Application No. 20849326.2 dated Aug. 18, 2022, 11 pages.
(Continued)

*Primary Examiner* — Sinh Tran
*Assistant Examiner* — Zhenzhen Wu
(74) *Attorney, Agent, or Firm* — Nixon & Vanderhye, P.C.

(57) ABSTRACT

An embodiment of the disclosure relates to a foldable electronic device including a plurality of cameras, providing a preview image of a camera in response to folding or unfolding of the device and an operating method thereof. A foldable electronic device according to an embodiment of the disclosure may include: a plurality of cameras, at least one display, at least one processor operatively connected with the plurality of the cameras and the at least one display, and at least one memory operatively connected with the at least one processor, and the at least one memory may store instructions which, when executed, cause the at least one processor to: while a first preview image corresponding to a first camera among the plurality of the cameras is displayed
(Continued)

on the at least one display, select at least one other camera, based on an analysis result of at least one object included in the first preview image, in response to detecting folding or unfolding of the electronic device, display a second preview image corresponding to the selected at least one other camera, and obtain a captured image based on the displayed second preview image.

20 Claims, 19 Drawing Sheets

(51) Int. Cl.
  *H04N 23/63* (2023.01)
  *H05K 1/02* (2006.01)
(52) U.S. Cl.
  CPC ... *H05K 1/028* (2013.01); *G06F 2203/04803* (2013.01); *H04M 2201/38* (2013.01)
(58) Field of Classification Search
  CPC .......... H04M 2201/34; H04M 2201/36; H04N 23/632; H04N 23/45; H04N 23/53; H04N 23/611; H04N 23/635; H04N 23/698; H04N 23/90; H05K 1/028; G06F 2203/04803; G06F 1/1616; G06F 1/1647; G06F 1/1652; G06F 1/1686; G06F 1/1677; G06V 40/165
  See application file for complete search history.

(56) References Cited

U.S. PATENT DOCUMENTS

| | | | |
|---|---|---|---|
| 10,972,662 B2 | 5/2021 | Lee et al. | |
| 2008/0178232 A1* | 7/2008 | Velusamy | H04N 23/66 725/87 |
| 2013/0321340 A1* | 12/2013 | Seo | H04M 1/724 345/174 |
| 2014/0098188 A1 | 4/2014 | Kwak et al. | |
| 2014/0184846 A1 | 7/2014 | Yoon et al. | |
| 2014/0253693 A1 | 9/2014 | Shikata | |
| 2014/0285476 A1 | 9/2014 | Cho et al. | |
| 2015/0015762 A1 | 1/2015 | Kim et al. | |
| 2016/0050408 A1 | 2/2016 | Lee et al. | |
| 2016/0085325 A1 | 3/2016 | Lee et al. | |
| 2017/0013179 A1 | 1/2017 | Kang et al. | |
| 2017/0026582 A1 | 1/2017 | Kim et al. | |
| 2017/0094168 A1 | 3/2017 | Kang et al. | |
| 2018/0270420 A1 | 9/2018 | Lee et al. | |
| 2018/0332205 A1* | 11/2018 | Hawthorne | G06F 1/1605 |
| 2019/0007620 A1 | 1/2019 | Lei et al. | |
| 2020/0344463 A1* | 10/2020 | Lynch | H04N 13/296 |
| 2023/0044497 A1* | 2/2023 | Zhang | G06F 3/1423 |

FOREIGN PATENT DOCUMENTS

| | | |
|---|---|---|
| KR | 10-0803504 | 2/2008 |
| KR | 10-2014-0115913 | 10/2014 |
| KR | 10-2015-0007875 | 1/2015 |
| KR | 10-2016-0021497 | 2/2016 |
| KR | 10-2016-0034660 | 3/2016 |
| KR | 10-2017-0006559 | 1/2017 |
| KR | 10-2017-0038365 | 4/2017 |
| KR | 10-2018-0106076 | 10/2018 |
| KR | 10-1992306 | 6/2019 |

OTHER PUBLICATIONS

International Search Report for PCT/KR2020/010497, mailed Dec. 2, 2020, 3 pages.
Written Opinion of the ISA for PCT/KR2020/010497, mailed Dec. 2, 2020, 4 pages.
Notice of Patent Grant dated Apr. 16, 2024 in Korean Patent Application No. 10-2019-0096299 and English-language translation.
Extended Search Report dated Jun. 11, 2024 in European Patent Application No. 24165647.9.
Office Action dated Jan. 1, 2023 in Korean Patent Application No. 10-2019-0096299 and English-language translation.
Communication pursuant to Article 94(3) EPC dated Nov. 22, 2023 in European Patent Application No. 20849326.2.
Office Action dated Jul. 12, 2024 in Chinese Patent Application No. 202080056133.4 and English-language translation.

* cited by examiner

ELECTRONIC DEVICE FOR PROVIDING CAMERA PREVIEW IMAGE AND OPERATING METHOD THEREOF

CROSS-REFERENCE TO RELATED APPLICATIONS

This application is a continuation of International Application No. PCT/KR2020/010497 designating the United Stated, filed on Aug. 7, 2020, in the Korean Intellectual Property Receiving Office and claiming priority to Korean Patent Application No. 10-2019-0096299, filed on Aug. 7, 2019, in the Korean Intellectual Property Office, the disclosures of which are incorporated by reference herein in their entireties.

BACKGROUND

Field

The disclosure relates to an electronic device for providing a preview image of a camera in response to folding or unfolding of a foldable device including a plurality of cameras and an operating method thereof.

Description of Related Art

With recent development of digital technology, electronic devices of various types such as a mobile communication terminal, a smart phone, a tablet personal computer (PC), a personal digital assistant (PDA), an electronic notebook, a notebook or a wearable device are widely used. The electronic device has reached a mobile convergence stage embracing functions of other devices. For example, the electronic device may provide call functions such as a voice call and a video call, message transmission/reception functions such as a short message service (SMS)/multimedia message service (MMS) and e-mail, an electronic notebook function, a photographing function, a broadcast playback function, a video playback function, a music playback function, an Internet function, a messenger function, a game function or a social networking service (SNS) function.

In addition, the electronic device may include a plurality of cameras including at least one front camera and at least one rear camera, to satisfy various user needs related to the photographing function.

Since such an electronic device includes one display having a fixed size, fields of view of the plurality of the cameras are mostly fixed. Hence, there is inconvenience in having to provide additional equipment such as a selfie stick to capture more people or a wider landscape. However, even if the additional equipment is provided, the camera shooting itself is uneasy, a subject size reduces compared to the fixed display size as the electronic device gets farther away, and accordingly it is difficult to accurately identify a state of the subject while capturing it.

In addition, such an electronic device may be implemented to be foldable. That is, the electronic device may be folding based on a center region. The electronic device implemented to be foldable (hereafter, a foldable electronic device) may include more available surfaces, than an electronic device which is not. Thus, the foldable electronic device may include a plurality of cameras and a plurality of displays having different functions and performances. However, in photographing using the plurality of the cameras and the plurality of the displays, even if the camera to be used for the photographing or the display for displaying a camera preview image is changed, parameters related to the photographing (e.g., a field of view, a resolution, an aspect ratio) are maintained the same. That is, there is inconvenience in that a user needs to manually set (or change) the parameters related to the photographing. Hence, it is demanded to provide the user with various services related to the photographing using folding (or unfolding) of the foldable electronic device as a triggering event, even if there is no explicit user input for setting (or changing) a function or an effect related to the photographing.

SUMMARY

A foldable electronic device according to an example embodiment of the disclosure may include: a plurality of cameras, at least one display, at least one processor operatively connected with the plurality of the cameras and the at least one display, and at least one memory operatively connected with the at least one processor, and the at least one memory may store instructions which, when executed, cause the at least one processor to: while a first preview image corresponding to a first camera among the plurality of the cameras is displayed on the at least one display, select at least one other camera based on an analysis result of at least one object included in the first preview image, in response to detecting folding or unfolding of the electronic device, display a second preview image corresponding to the selected at least one other camera, and obtain a captured image based on the displayed second preview image.

A method of operating a foldable electronic device according to an example embodiment of the disclosure may include: while a first preview image corresponding to a first camera among a plurality of cameras of the electronic device is displayed on at least one display of the electronic device, selecting at least one other camera of the electronic device based on an analysis result of at least one object included in the first preview image, in response to detecting folding or unfolding of the electronic device, displaying a second preview image corresponding to the selected at least one other camera, and obtaining a captured image based on the displayed second preview image.

A foldable electronic device according to an example embodiment of the disclosure may, in a camera preview state, change setting related to preview image displaying (e.g., a camera providing a preview image, or an aspect ratio), in response to folding and/or unfolding of the foldable electronic device. Even if there is no user's explicit input, the foldable electronic device according to an example embodiment of the disclosure may select a camera for providing the preview image, and provide a new preview image according to an optimal setting value according to a use situation of the foldable electronic device, in response to the folding and/or the unfolding of the foldable electronic device. Thus, a continuous camera shooting environment appropriate for the user's shooting situation may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With regard to descriptions of the drawings, the same or similar reference numerals may be used for the same or similar components.

DETAILED DESCRIPTION

Figure 1:
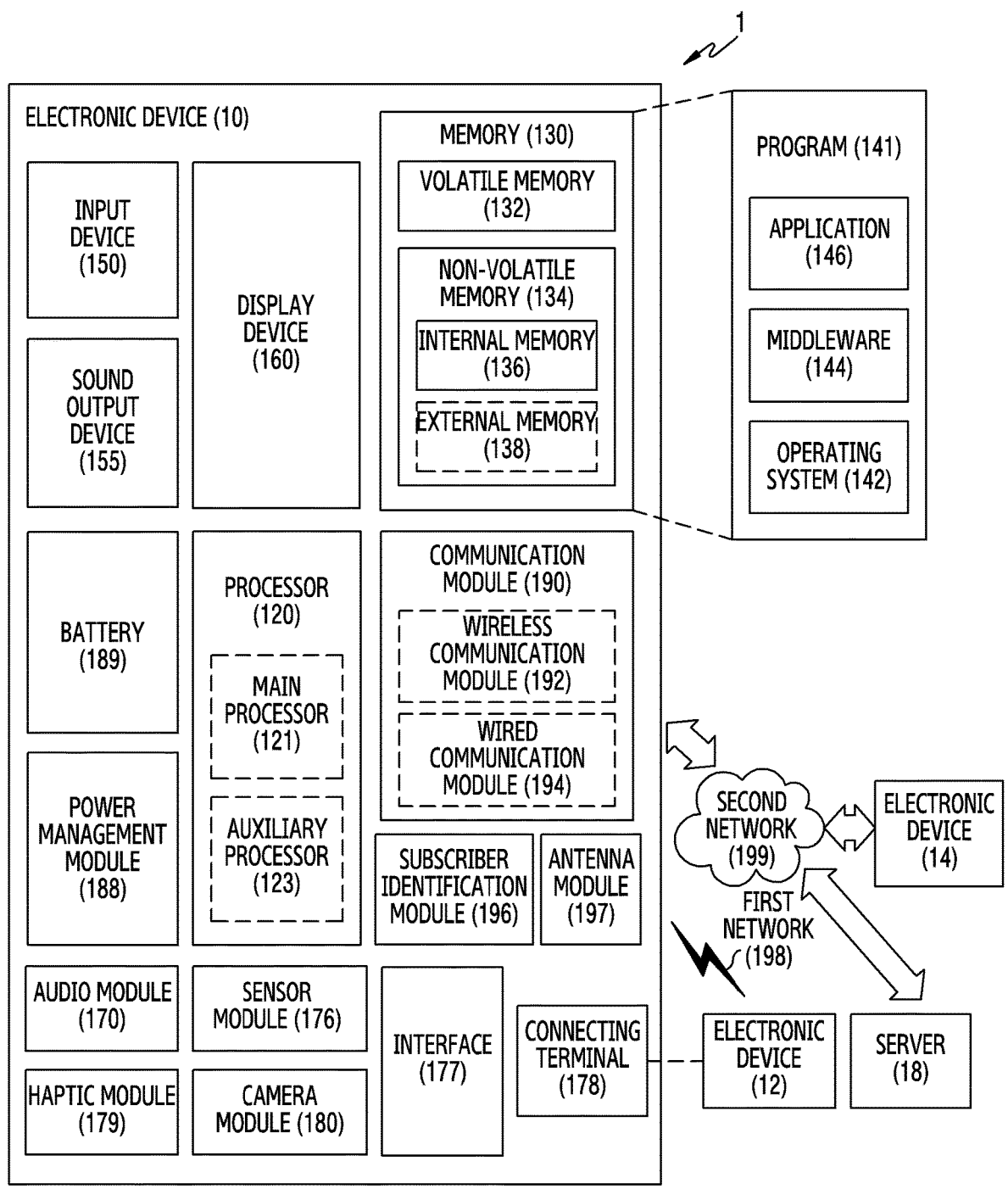
FIG. 1 is a block diagram illustrating an example electronic device in a network environment, according to various embodiments.

FIG. 1 is a block diagram illustrating an example electronic device 10 in a network environment 1 according to various embodiments. Referring to FIG. 1, the electronic device 10 in the network environment 1 may communicate with an electronic device 12 via a first network 198 (e.g., a short-range wireless communication network), or an electronic device 14 or a server 18 via a second network 199 (e.g., a long-range wireless communication network). According to an embodiment, the electronic device 10 may communicate with the electronic device 14 via the server 18. According to an embodiment, the electronic device 10 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In various embodiments, at least one (e.g., the display device 160 or the camera module 180) of the components may be omitted from the electronic device 10, or one or more other components may be added in the electronic device 10. In various embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 141) to control at least one other component (e.g., a hardware or software component) of the electronic device 10 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 10, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 10. The various data may include, for example, software (e.g., the program 141) and input data or output data for a command related thereto. The memory 130 may include the volatile memory 132 or the non-volatile memory 134.

The program 141 may be stored in the memory 130 as software, and may include, for example, an operating system (OS) 142, middleware 144, or an application 146.

The input device 150 may receive a command or data to be used by other component (e.g., the processor 120) of the electronic device 10, from the outside (e.g., a user) of the electronic device 10. The input device 150 may include, for example, a microphone, a mouse, a keyboard, or a digital pen (e.g., a stylus pen).

The sound output device 155 may output sound signals to the outside of the electronic device 10. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 10. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 12) directly (e.g., wiredly) or wirelessly coupled with the electronic device 10.

The sensor module 176 may detect an operational state (e.g., power or temperature) of the electronic device 10 or an environmental state (e.g., a state of a user) external to the electronic device 10, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 10 to be coupled with the external electronic device (e.g., the electronic device 12) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 10 may be physically connected with the external electronic device (e.g., the electronic device 12). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 10. According to an embodiment, the power management module 188 may be implemented as at least part of, for example, a power management integrated circuit (PMIC).

The battery 189 may supply power to at least one component of the electronic device 10. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 10 and the external electronic device (e.g., the electronic device 12, the electronic device 14, or the server 18) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 10 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 10. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 10 and the external electronic device 14 via the server 18 coupled with the second network 199. Each of the electronic devices 12 and 14 may be a device of a same type as, or a different type, from the electronic device 10. According to an embodiment, all or some of operations to be executed at the electronic device 10 may be executed at one or more of the external electronic devices 12, 14, or 18. For example, if the electronic device 10 should perform a function or a service automatically, or in response to a request from a user or another device, the electronic device 10, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 10. The electronic device 10 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," coupled to," "connected with," "or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 141) including one or more instructions that are stored in a storage medium (e.g., internal memory 136 or external memory 138) that is readable by a machine (e.g., the electronic device 10). For example, a processor (e.g., the processor 120) of the machine (e.g., the electronic device 10) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
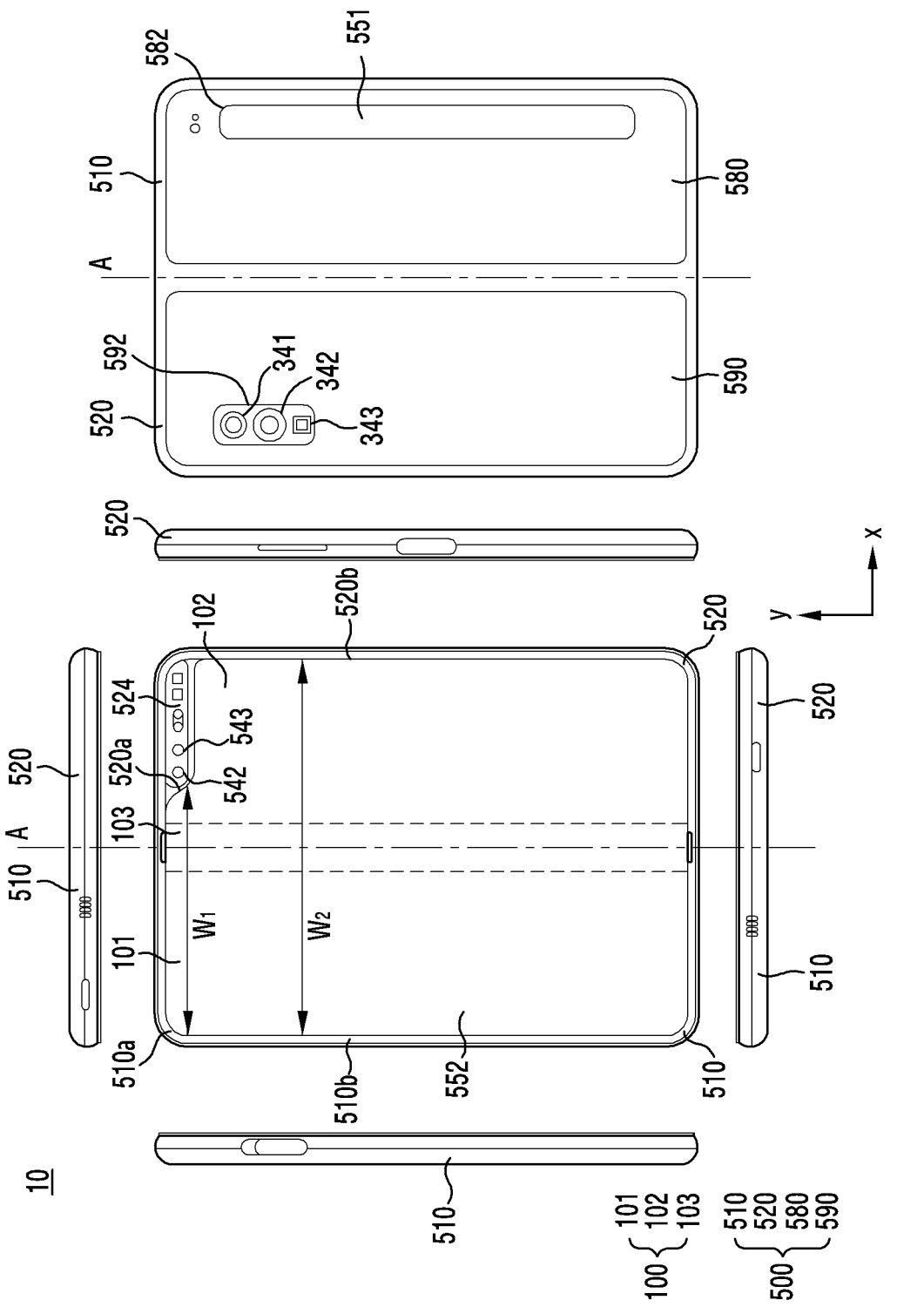
FIG. 2 is a diagram illustrating a foldable electronic device in an unfolded or flat state according to various embodiments.
Figure 3:
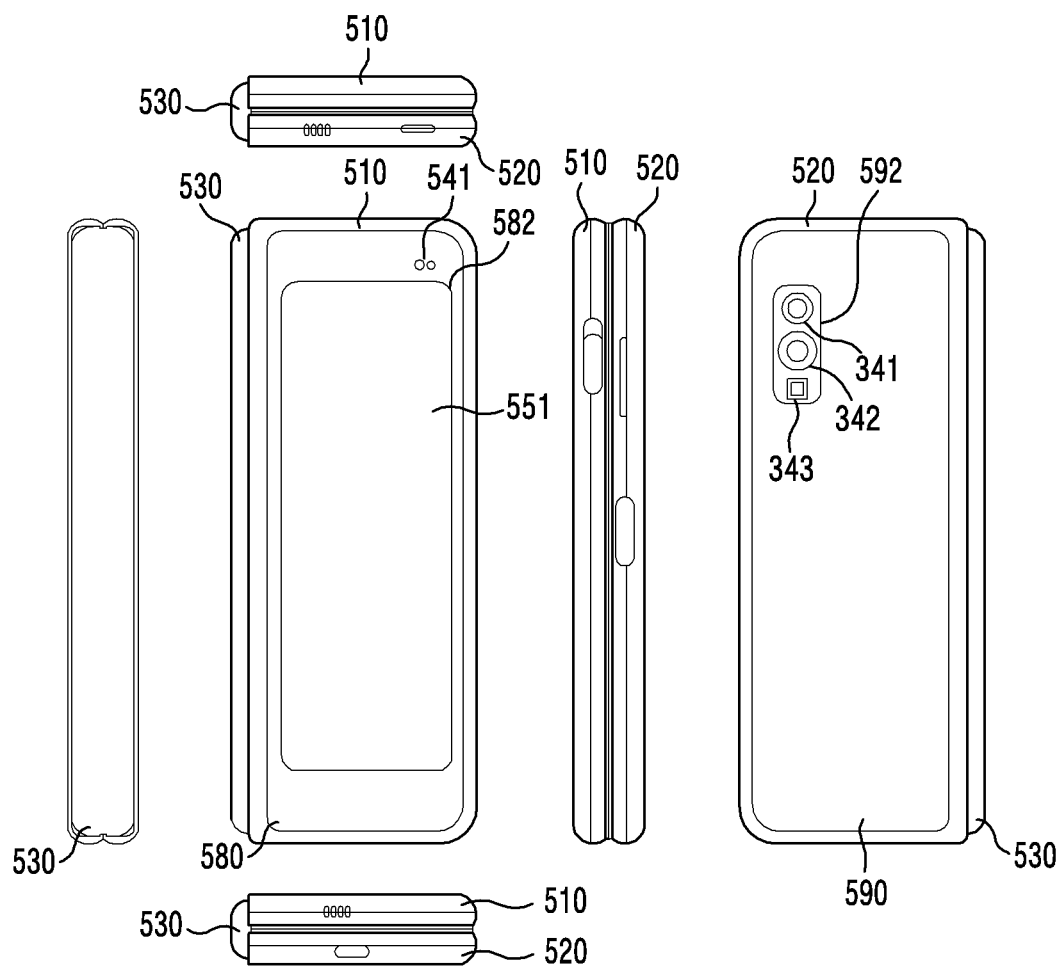
FIG. 3 is a diagram illustrating a foldable electronic device in a folded state according to various embodiments.

Referring to FIG. 2 and FIG. 3, in an embodiment, an electronic device 10 may include a foldable housing 500, a hinge cover 530 which covers a foldable portion of the foldable housing 500, and a flexible or foldable display 552 (hereafter, referred to as a second display) disposed in a space formed by the foldable housing 500. A surface on which the second display 552 is disposed is defined as a first surface or a front surface of the electronic device 10 in this document. The opposite surface of the front surface is defined as a second surface or a rear surface of the electronic device 10. Also, a surface surrounding a space between the front surface and the rear surface is defined as a third surface or a side surface of the electronic device 10. The electronic device 10 may correspond to the electronic device 10 disclosed in FIG. 1.

In an embodiment, the foldable housing 500 may include a first housing structure 510, a second housing structure 520 including a sensor region 524, a first rear cover 580, and a second rear cover 590. The foldable housing 500 of the electronic device 10 is not limited to the shape and the coupling shown in FIGS. 2 and 3, and may be implemented by other shape or combination and/or coupling of components. For example, in an embodiment, the first housing structure 510 and the first rear cover 580 may be integrally formed, and the second housing structure 520 and the second rear cover 590 may be integrally formed.

In the illustrated embodiment, the first housing structure 510 and the second housing structure 520 may be disposed on both sides based on a folding axis (axis A), and may have a shape which is symmetric on the whole with respect to the folding axis A. The first housing structure 510 and the second housing structure 520 may have different angles or distances depending on whether a state of the electronic device 10 is a flat state, a folded state, or an intermediate state to be explained. In the illustrated embodiment, unlike the first housing structure 510, the second housing structure 520 may further include the sensor region 524 in which various sensors are disposed. In an embodiment, the second housing structure 520 and the first housing structure 510 may have a mutually symmetric shape in other regions than the sensor region 524.

In an embodiment, as shown in FIG. 2, the first housing structure 510 and the second housing structure 520 together may form a recess for accommodating the second display 552. In the illustrated embodiment, due to the sensor region 524, the recess may have two or more different widths in a direction perpendicular to the folding axis A.

For example, the recess may have (1) a first width w1 between a first portion 510*a* parallel to the folding axis A in the first housing structure 510 and a first portion 520*a* formed at an edge of the sensor region 524 in the second housing structures 520, and (2) a second width w2 formed by a second portion 510*b* of the first housing structure 510 and a second portion 520*b* not corresponding to the sensor region 524 of the second housing structure 520 and parallel to the folding axis A. In this case, the second width w2 may be formed longer than the first width w1. In other words, the first portion 510*a* of the first housing structure 510 and the first portion 520*a* of the second housing structure 520 having the asymmetric shape may form the first width w1 of the recess, and the second portion 510*b* of the first housing structure 510 and the second portion 520*b* of the second housing structure 520 having the symmetrical shape may form the second width w2 of the recess. In an embodiment, the first portion 520*a* and the second portion 520*b* of the second housing structure 520 may be different in distance from the folding axis A. The width of the recess is not limited to the illustrated example. In various embodiments, the recess may have a plurality of widths based on the shape of the sensor region 524 or the portion having the asymmetric shape of the first housing structure 510 and the second housing structure 520.

In an embodiment, at least part of the first housing structure 510 and the second housing structure 520 may be formed of a metallic material or a nonmetallic material having rigidity of a magnitude selected to support the second display 552.

In an embodiment, the sensor region 524 may be formed to have a designated region adjacent to one corner of the second housing structure 520. However, the arrangement, the shape, and the size of the sensor region 524 are not limited to the illustrated example. For example, in an embodiment, the sensor region 524 may be provided at another corner of the second housing structure 520 or an arbitrary region between an upper corner and a lower corner. In an embodiment, components for performing various functions imbedded in the electronic device 10 may be exposed to the front surface of the electronic device 10 through the sensor region 524, or through one or more openings provided in the sensor region 524. In an embodiment, the components may include various sensors. The sensors may include, for example, at least one of a front camera, a receiver or a proximity sensor. The front camera may correspond to at least one of the second front camera 542 and the third front camera 543. In an embodiment, the front camera may further include a fourth front camera (not shown) which is a camera for applying a special effect to a captured image. For example, the fourth front camera (not shown) may be a camera for applying the special effect (e.g., bokeh or out-focusing, telephoto, blur) to the captured image.

The first rear cover 580 may be disposed on one side of the folding axis on the rear surface of the electronic device 10, and may have, for example, a substantially rectangular periphery, and the periphery may be surrounded by the first housing structure 510. Similarly, the second rear cover 590 may be disposed on the other side of the folding axis on the rear surface of the electronic device 10, and its periphery may be surrounded by the second housing structure 520.

In the illustrated embodiment, the first rear cover 580 and the second rear cover 590 may have a substantially symmetrical shape based on the folding axis (the axis A). However, it is merely an example, and the first rear cover 580 and the second rear cover 590 do not necessarily have the symmetrical shape. In an embodiment, the electronic device 10 may include the first rear cover 580 and the second rear cover 590 of various shapes. In an embodiment, the first rear cover 580 may be integrally formed with the first housing structure 510, and the second rear cover 590 may be integrally formed with the second housing structure 520.

In an embodiment, the first rear cover 580, the second rear cover 590, the first housing structure 510, and the second housing structure 520 may form a space for mounting various components (e.g., a printed circuit board, or a battery) of the electronic device 10. In an embodiment, one or more components may be disposed or visually exposed on the rear surface of the electronic device 10. For example, at least part of at least one front camera (e.g., the first front camera 541) may be visually exposed in the first rear cover 580. For example, at least part of the first display 551 may be visually exposed through a first rear region 582 of the first rear cover 580. In an embodiment, one or more components or sensors may be visually exposed through a second rear region 592 of the second rear cover 590. In an embodiment, the sensors may include a proximity sensor and/or a rear camera. The rear camera may correspond to at least one of a first rear camera 341, a second rear camera 342, and a third rear camera 343. In an embodiment, the rear camera may further include a fourth rear camera (not shown) which is a camera for applying a special effect to the captured image. For example, the fourth rear camera (not shown) may be the camera for applying the special effect (e.g., bokeh or outfocusing, telephoto, blur) to the captured image.

In an embodiment, the first front camera 541 may support a first field of view range (or correspond to the first field of view range). The first field of view range may be a field of view range for displaying the preview image in a normal mode. The first field of view range may correspond to a range of 40 degrees through 60 degrees.

In an embodiment, the second front camera 542 and the third front camera 543 may correspond to different functions or performances respectively, and may have higher specifications than the first front camera 541. For example, the second front camera 542 may correspond to a second field of view range (e.g., 60 through 90 degrees) (or support the second field of view range), the third front camera 543 may correspond to a third field of view range (90 degrees through 180 degrees), and the second field of view range and the third field of view range may be wider field of view ranges than the first field of view range corresponding to the first front camera 541. The third field of view range may be a wider field of view range than the second field of view range. As another example, the second front camera 542 and the third front camera 543 may support a higher resolution than the first front camera 541.

In an embodiment, the first rear camera 341, the second rear camera 342, and the third rear camera 343 may correspond to different functions or performances. For example, the first rear camera 341 may correspond to the second field of view range (or support the second field of view range), the second rear camera 342 may correspond to the first field of view range which is a narrower field of view range than the second field of view range, and the first field of view range may correspond to a telephoto or close-up mode. The third rear camera 343 may correspond to a third field of view range which is a wider field of view range than the second field of view range.

In an embodiment, the second field of view range corresponding to the first rear camera 341 may correspond to a field of view range for displaying the preview image in a wide-angle mode.

In an embodiment, the second rear camera 342 may correspond to a tele camera for magnifying and capturing a subject.

In an embodiment, the third field of view range corresponding to the third rear camera 343 may correspond to a field of view range for displaying the preview image in an ultra-wide-angle mode.

Referring to FIG. 3, the hinge cover 530 may be disposed between the first housing structure 510 and the second housing structure 520, and configured to cover an internal part (e.g., a hinge structure). In an embodiment, the hinge cover 530 may be covered by a part of the first housing structure 510 and the second housing structure 520, or exposed to outside, depending on the state (the flat state or the folded state) of the electronic device 10.

For example, if the electronic device 10 is in the flat state as shown in FIG. 2, the hinge cover 530 may be covered by the first housing structure 510 and the second housing structure 520 not to be exposed. For example, if the electronic device 10 is in the folded state (e.g., a fully folded state) as shown in FIG. 3, the hinge cover 530 may be exposed to the outside between the first housing structure 510 and the second housing structure 520. For example, if the first housing structure 510 and the second housing structure 520 are folded with a certain angle in an intermediate state, the hinge cover 530 may be partially exposed to the outside between the first housing structure 510 and the second housing structure 520. However, in this case, the exposed region may be less than the fully folded state. In an embodiment, the hinge cover 530 may include a curved surface.

The second display 552 may be disposed on a space formed by the foldable housing 500. For example, the second display 552 may be mounted on a recess formed by the foldable housing 500, and construct most of the front surface of the electronic device 10.

Hence, the front surface of the electronic device 10 may include the second display 552 and some region of the first housing structure 510 and some region of the second housing structure 520 adjacent to the second display 552. The rear surface of the electronic device 10 may include the first rear cover 580, some region of the first housing structure 510 adjacent to the first rear cover 580, the second rear cover 590, and some region of the second housing structure 520 adjacent to the second rear cover 590.

The second display 552 may indicate a display in which at least some region may be transformed into a flat surface or a curved surface. In an embodiment, the second display 552 may include a folding region 103, a first region 101 disposed on one side (a left side of the folding region 103 shown in FIG. 2) based on the folding region and a second region 102 disposed on the other side (a right side of the folding region 103 shown in FIG. 2).

The region division of the second display 552 shown in FIG. 2 is merely an example, and the second display 552 may be divided into a plurality of (e.g., four or more or two) regions according to its structure or function. For example, the region of the second display 552 may be divided by the folding region 103 or the folding axis (axis A) extending in parallel to the y-axis in the embodiment shown in FIG. 2, but the second display 552 may be divided based on another folding region (e.g., a folding region parallel to the x-axis) or another folding axis (e.g., a folding axis parallel to the x-axis) in an embodiment.

The first region 101 and the second region 102 may have a shape which is symmetric on the whole based on the folding region 103. However, unlike the first region 101, the second region 102 may include a notch which is cut according to the presence of the sensor region 524, but may have the shape symmetrical to the first region 101 in other regions. In other words, the first region 101 and the second region 102 may include the portion having the symmetrical shape, and the having the asymmetrical shape.

Hereafter, the operations of the first housing structure 510 and the second housing structure 520 and each region of the second display 552 are described according to the state of the electronic device 10 (e.g., the flat state and the folded state).

In an embodiment, if the electronic device 10 is in the flat state (e.g., FIG. 2), the first housing structure 510 and the second housing structure 520 may be arranged to make an angle of 180 degrees and face the same direction. A surface of the first region 101 and a surface of the second region 102 of the second display 552 may form 180 degrees, and face the same direction (e.g., the front direction of the electronic device). The folding region 103 may form the same plane as the first region 101 and the second region 102.

In an embodiment, if the electronic device 10 is in the folded state (e.g., FIG. 3), the first housing structure 510 and the second housing structure 520 may be disposed to face each other. The surface of the first region 101 and the surface of the second region 102 of the second display 552 may form a narrow angle (e.g., between 0 degree and 10 degrees), and face each other. At least part of the folding region 103 may be formed as a curved surface having a designated curvature.

In an embodiment, if the electronic device 10 is in the intermediate state, the first housing structure 510 and the second housing structure 520 may be disposed at a certain angle. The surface of the first region 101 and the surface of the second region 102 of the second display 552 may form an angle which is greater than the folded state and smaller than the flat state. At least part of the folding region 103 may be formed as a curved surface having a designated curvature, wherein the curvature may be smaller than that of the folded state.

Figure 4:
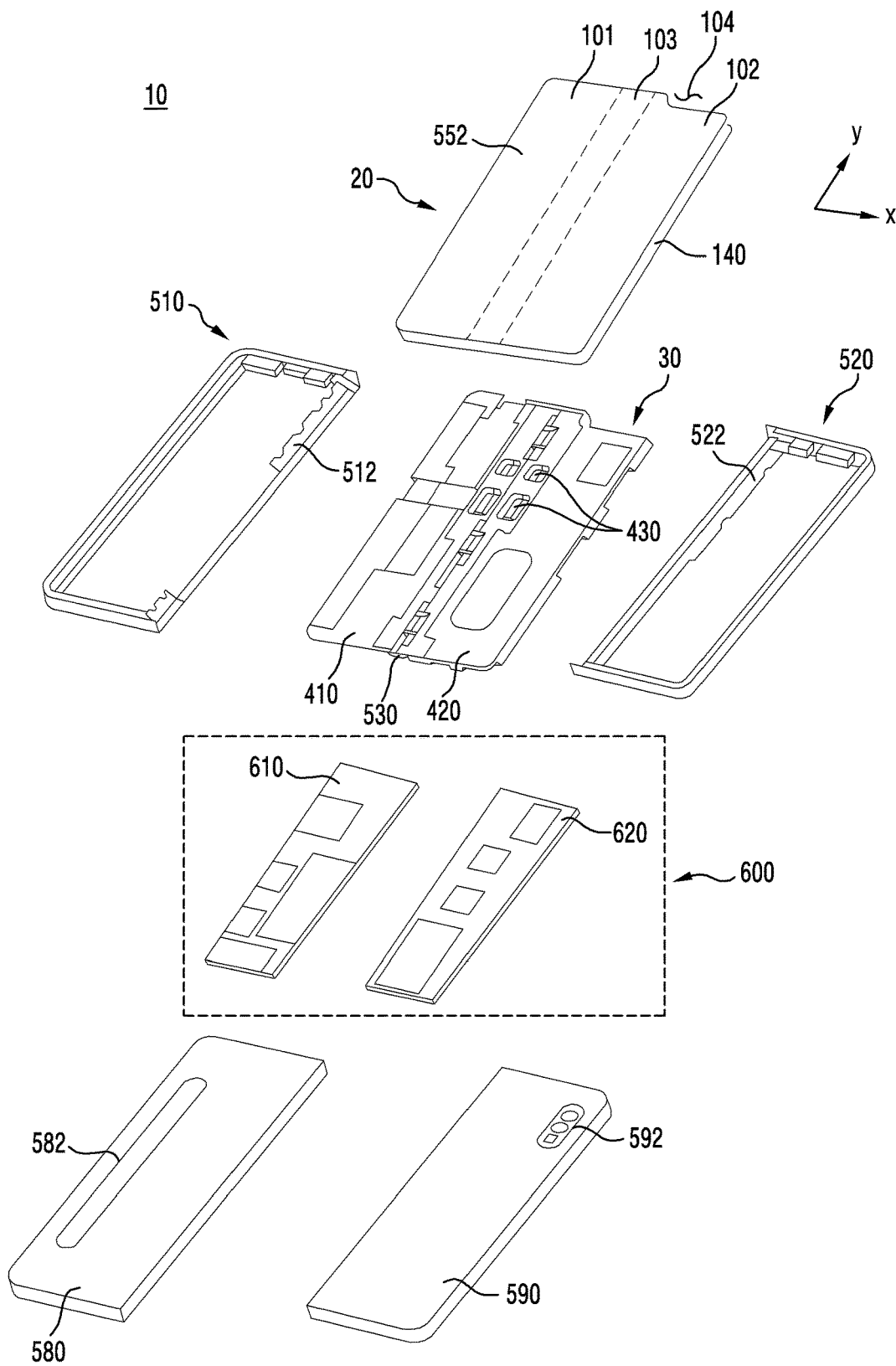
FIG. 4 is an exploded perspective view of a foldable electronic device according to various embodiments.

FIG. 4 is an exploded perspective view of an electronic device according to various embodiments.

Referring to FIG. 4, in an embodiment, the electronic device 10 may include a display unit 20, a bracket assembly 30, a substrate unit 600, a first housing structure 510, a second housing structure 520, a first rear cover 580 and a second rear cover 590. In this document, the display unit 20 may be referred to as a display module or a display assembly.

The display unit 20 may include the second display 552, and one or more plates or layers 140 on which the second display 552 is mounted. In an embodiment, the plate 140 may be disposed between the second display 552 and the bracket assembly 30. The second display 552 may be disposed on at least a part of one surface (e.g., an upper surface based on FIG. 3) of the plate 140. The plate 140 may be formed in a shape corresponding to the second display 552. For example, some region of the plate 140 may be formed in a shape corresponding to a notch 104 of the second display 552.

The bracket assembly 30 may include a first bracket 410, a second bracket 420, a hinge structure disposed between the first bracket 410 and the second bracket 420, a hinge cover 530 for covering the hinge structure when viewed from the outside, and a wiring member 430 (e.g., a flexible printed circuit (FPC)) crossing the first bracket 410 and the second bracket 420.

In an embodiment, the bracket assembly 30 may be disposed, between the plate 140 and the substrate unit 600. For example, the first bracket 410 may be disposed between the first region 101 of the second display 552 and the first substrate 610. The second bracket 420 may be disposed between the second region 102 of the second display 552 and the second substrate 620.

In an embodiment, the wiring member 430 and at least part of the hinge structure 300 may be disposed inside the bracket assembly 30. The wiring member 430 may be disposed in a direction crossing the first bracket 410 and the second bracket 420 (e.g., in the x-axis direction). The wiring member 430 may be disposed in a direction (e.g., the x-axis direction) perpendicular to the folding axis (e.g., the y-axis or the folding axis A of FIG. 1) of the folding region 103 of the electronic device 10.

The substrate unit 600 may include, as mentioned above, the first substrate 610 disposed on the first bracket 410 and the second substrate 620 disposed on the second bracket 420. The first substrate 610 and the second substrate 620 may be disposed inside a space formed by the bracket assembly 30, the first housing structure 510, the second housing structure 520, the first rear cover 580 and the second rear cover 590. Components for implementing various functions of the electronic device 10 may be mounted on the first substrate 610 and the second substrate 620.

The first housing structure 510 and the second housing structure 520 may be assembled to be coupled to both sides of the bracket assembly 30 while the display unit 20 is coupled to the bracket assembly 30. As will be described later, the first housing structure 510 and the second housing structure 520 may slide on both sides of the bracket assembly 30 to be coupled with the bracket assembly 30.

In an embodiment, the first housing structure 510 may include a first rotation support surface 512, and the second housing structure 520 may include a second rotation support surface 522 corresponding to the first rotation support surface 512. The first rotation support surface 512 and the second rotation support surface 522 may include a curved surface corresponding to the curved surface included in the hinge cover 530.

In an embodiment, if the electronic device 10 is in the flat state (e.g., the electronic device of FIG. 1), the first rotation support surface 512 and the second rotation support surface 522 may cover the hinge cover 530 not to expose the hinge cover 530 to the rear surface of the electronic device 10 or to expose minimum. Meanwhile, if the electronic device 10 is in the folded state (e.g., the electronic device of FIG. 2), the first rotation support surface 512 and the second rotation support surface 522 may rotate along the curved surface included in the hinge cover 530 to expose the hinge cover 530 maximum to the rear surface of the electronic device 10.

Figure 5:
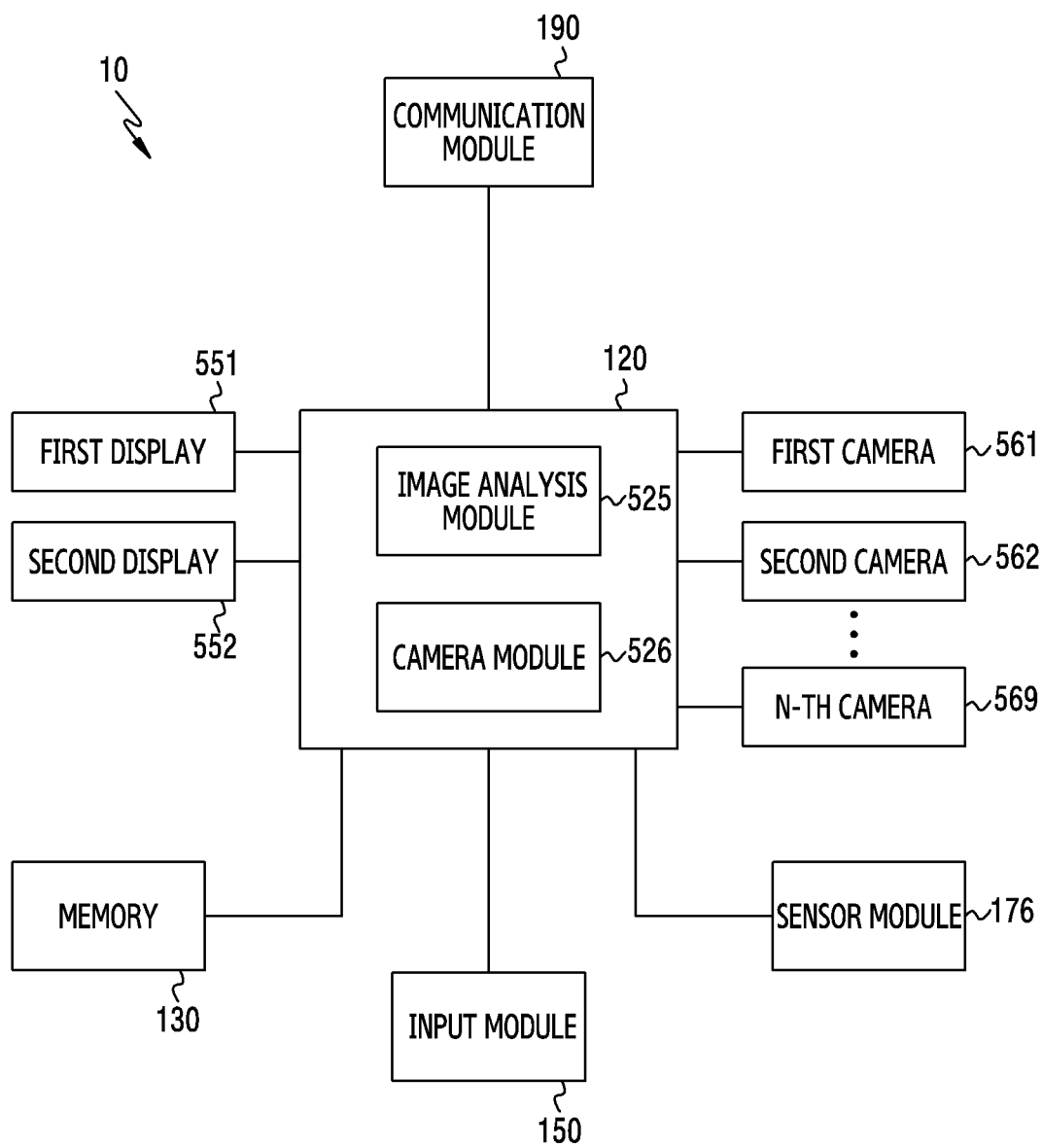
FIG. 5 is a block diagram illustrating an example configuration of an electronic device according to various embodiments.

FIG. 5 is a block diagram illustrating an example configuration of an electronic device 10 according to various embodiments.

Referring to FIG. 5, the electronic device 10 may include a processor (e.g., including processing circuitry) 120, a communication module (comprising communication circuitry) 190, a memory 130, an input module (e.g., including input circuitry) 150, a first display 551, a second display 552, a sensor module (e.g., including at least one sensor) 176 and a first through N-th cameras 561 through 569. In an embodiment, N may be a natural number equal to or greater than 3.

In an embodiment, the processor 120 may include various processing circuitry and control at least one component included in the electronic device 10. For example, the processor 120 may control the first display 551, to display a first preview image corresponding to the first camera 561. For example, the processor 120 may analyze at least one object included in the first preview image.

In an embodiment, the processor 120 may include an image analysis module 525 and a camera module 526 (e.g., each including various processing circuitry and/or executable program instructions). In an embodiment, the processor 120 may execute the image analysis module 525 and the camera module 526. In an embodiment, the processor 120 may control at least one component included in the electronic device 10 through the image analysis module 525 and the camera module 526. In an embodiment, the image analysis module 525 and the camera module 526 may be implemented as a physical circuit, or as a software program.

In an embodiment, the image analysis module 525 may analyze at least one object included in the preview image (e.g., the first preview image) displayed on the display (e.g., the first display 551). In an embodiment, in analyzing at least one object, the image analysis module 525 may determine characteristic information (e.g., size, color, shape, shadow, geometric characteristics, motion information, or movement direction information) of at least one object. In an embodiment, in analyzing at least one object, the image analysis module 525 may determine a type (e.g., a person, an animal, a building, or a food) of the at least one object. The characteristic information of the at least one object may be used to determine the type of the at least one object.

In an embodiment, object analysis result information, which is generated at the image analysis module 525, may be provided to the camera module 526.

In an embodiment, the camera module 526 may process camera preview image data input from the first through N-th cameras 561 through 569. For example, the camera module 526 may forward the first preview image data input from the first camera 561 to the image analysis module 525, or receive the object analysis result information from the image analysis module 525. For example, the camera module 526 may control the first display 551 corresponding to the first camera 561, to display the first preview image input from the first camera 561.

In an embodiment, based on the object analysis result information received from the image analysis module 525, the camera module 526 may select at least one camera (e.g., the second camera 562) to be activated in response to the folding and/or the unfolding of the electronic device 10. In an embodiment, the camera module 526 may forward the object analysis result information (or, information generated by processing the object analysis result information) received from the image analysis module 525, to the at least one camera selected. In an embodiment, if a designated condition is satisfied, the camera module 526 may provide the information to the at least one selected camera. In an embodiment, the designated condition may be activation of the at least one selected camera (e.g., the second camera 562). In an embodiment, the designated condition may be detection of the folding, or detection of the unfolding of the electronic device 10. In an embodiment, the camera module 526 may forward the object analysis result information received from the image analysis module 525, or the information generated by processing the object analysis result information, to the at least one selected camera, if activating the at least one selected camera (e.g., the second camera 562) (e.g., if detecting the folding and/or the unfolding of the electronic device 10). At least one camera activated may recognize at least one subject, using the information from the camera module 526. At least one camera activated may recognize at least one subject faster than not using the information, by use of the information from the camera module 526.

In an embodiment, the first through the N-th cameras 561 through 569 may embrace a plurality of cameras included in the electronic device 10. For example, the first camera 561 may correspond to the first front camera 541 disclosed in FIG. 2, and the second camera 562 and a third camera (not shown) may correspond to the second front camera 542 and the third front camera 543 respectively disclosed in FIG. 2. However, this is only an example, and the first camera 561, the second camera 562, and the third camera (not shown) may correspond to the first rear camera 341, the second rear camera 342, and the third rear camera 343 respectively shown in FIG. 3.

In an embodiment, at least one camera (e.g., the first camera 561) among the first through N-th cameras 561 through 569 may correspond to the first display 551, and at least one another camera (e.g., the second camera 561, and the third camera (not shown)) may correspond to the second display 552. For example, a preview image of the first camera 561 may be displayed on the first display 551, and a preview image of the second camera 562 or the third camera (not shown) may be displayed on the second display 552.

In an embodiment, the first through N-th cameras 561 through 569 may support different field of view ranges. However, this is only an example, and at least two cameras of the first through N-th cameras 561 through 569 may support the same field of view range.

In an embodiment, the first camera 561 may support a first field of view range. In an embodiment, the second camera 562 may support a second field of view range. In an embodiment, the third camera (not shown) may support a third field of view range.

In an embodiment, the first field of view range may be a view angle range for displaying the preview image in the normal mode. In an embodiment, the second field of view range may be a view angle range for displaying the preview image in the wide-angle mode. In an embodiment, the third field of view range may be a view angle range for displaying the preview image in the ultra-wide-angle mode. In an embodiment, the first field of view range may have a range of 40 through 60 degrees)(°). In an embodiment, the second field of view range may have a range of 60 to 90 degrees)(°). In an embodiment, the third field of view range may have a range of 90 to 180 degrees)(°).

In an embodiment, the first through N-th cameras 561 through 569 may have different resolutions. However, this is only an example, and at least two cameras of the first through N-th cameras 561 through 569 may have the same resolution.

In an embodiment, the first display 551 and the second display 552 may display content. For example, an application execution screen, an image (e.g., the preview image of the camera), a video, a call/message notification, and so on may be displayed.

In an embodiment, the first display 551 may have a vertical length longer than a horizontal length. Hence, even if a preview image corresponding to the same camera is displayed based on an aspect ratio in which the horizontal length is longer than the vertical length, the margin may increase compared to the opposite case.

In an embodiment, the second display 552 may have the horizontal length longer than the vertical length. Hence, even if a preview image corresponding to the same camera is displayed based on an aspect ratio in which the vertical length is longer than the horizontal length, the margin may increase compared to the opposite case.

In an embodiment, the memory 130 may store instructions for the electronic device 10 to carry out one or more operations according to embodiments of the disclosure, under control of the processor 120. For example, the memory 130 may store instructions causing the processor 120 to select at least one camera based on the analysis result of at least one object displayed in the first preview image.

In an embodiment, the memory 130 may store user history data, or user preference information related to the camera shooting.

In an embodiment, the input module 150 may include various input circuitry and be used for the electronic device 10 to receive a user input. For example, the input module 150 may include a physical user interface such as a button. Through the input module 150, the electronic device 10 may receive a user input for obtaining a captured image, and a user input for switching the camera or the display.

In an embodiment, the sensor module 176 may include various sensors and be disposed inside the foldable housing 500 or the hinge cover 530. In an embodiment, the sensor module 176 may include at least one of an angle sensor, a gyro sensor, an acceleration sensor, and a grip sensor. In an embodiment, sensor information of the sensor module 176 may be used for the processor 120 to identify which one of the flat state, the folded state, or the intermediate state the current state of the electronic device 10 corresponds to, or to detect state change (e.g., folding (changing from the flat state to the folded state), or unfolding (changing from the folded state to the flat state) of the electronic device 10.

The sensor module 176 may provide the sensor information used to detect the folding or the unfolding of the electronic device 10 to the processor 120 on a periodic basis or at event occurrence.

Figure 6:
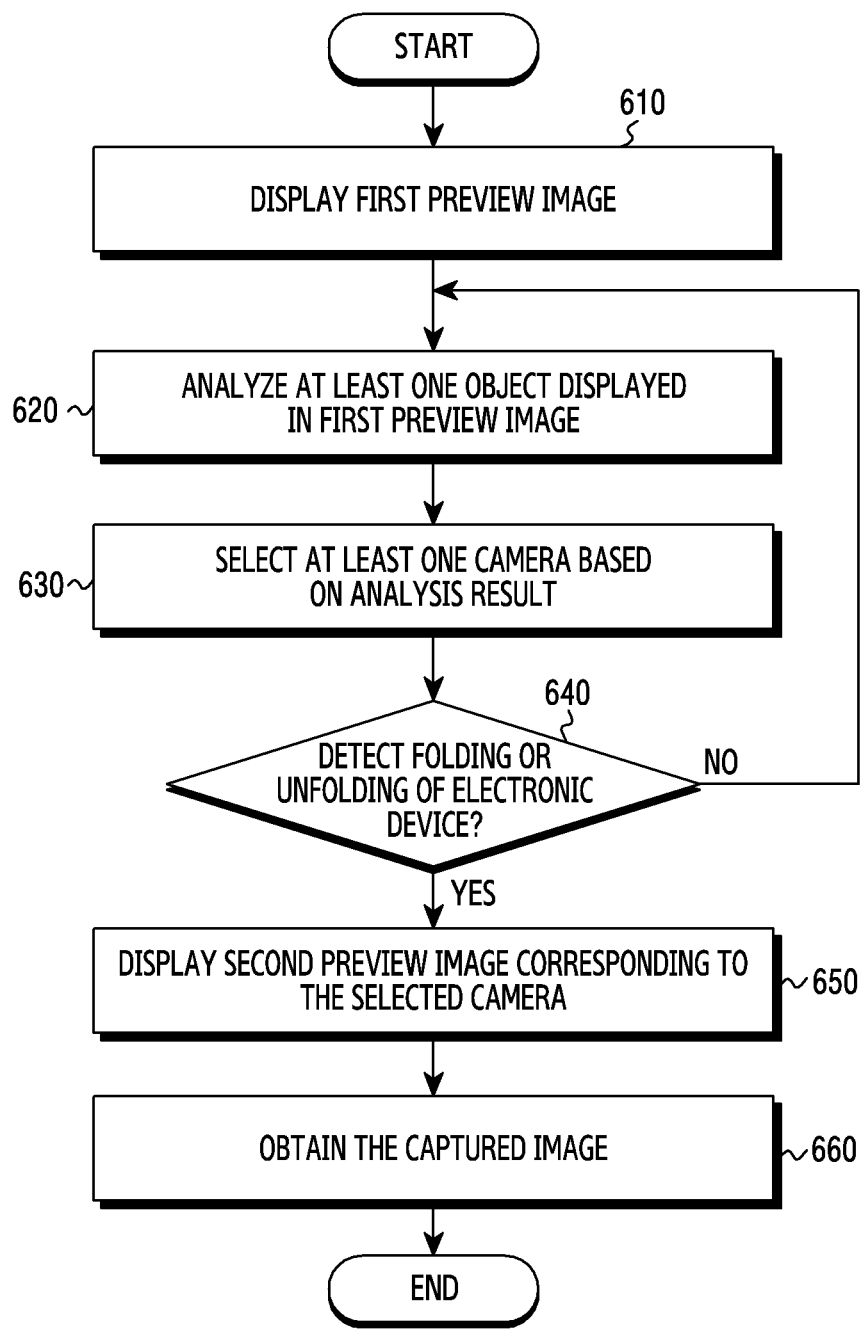
FIG. 6 is a flowchart illustrating an example operation of an electronic device according to various embodiments.

FIG. 6 is a flowchart illustrating an example operation of an electronic device (e.g., the electronic device 10) according to various embodiments. FIG. 6 may be described with reference to the components of the electronic device 10 of FIG. 1 through FIG. 5.

The operations disclosed in FIG. 6 may be performed by the electronic device 10, under the control of the processor 120 of FIG. 5. Hereafter, it is described that the electronic device 10 performs the operations disclosed in FIG. 6.

In operation 610, the electronic device 10 may display the first preview image. In an embodiment, the electronic device 10 displaying the first preview image may be in the folded (e.g., in-folded) state.

In an embodiment, the first preview image may be a preview image corresponding to the first front camera (e.g., the first front camera 541). The electronic device 10 may display the first preview image on the first display 551 corresponding to the first front camera 541. The first front camera 541 may correspond to the first field of view range.

In an embodiment, the first preview image may be a preview image corresponding to the first rear camera (e.g., the first rear camera 341). The electronic device 10 may display the first preview image on the first display 551 corresponding to the first rear camera 341. The first rear camera 341 may correspond to the second field of view range.

In operation 620, the electronic device 10 may analyze at least one object displayed in the first preview image. The electronic device 10 may analyze at least one object by conducting a scene recognition function (e.g., a face recognition function). In analyzing at least one object, the electronic device 10 may determine characteristic information (e.g., size, color, shape, shadow, and geometric characteristics) of the at least one object. In analyzing the at least one object, the electronic device 10 may determine the type (e.g., a person, an animal, a building, food) of the at least one object, based on the determined characteristic information.

In operation 630, the electronic device 10 may select at least one camera, based on the analysis result.

In an embodiment, the electronic device 10 may select at least one camera, among all of the cameras included in the electronic device 10.

In an embodiment, the electronic device 10 may select at least one camera, among other cameras than the camera (e.g., the first front camera 541) corresponding to the preview image currently being displayed.

In an embodiment, if the camera corresponding to the preview image currently displayed is the front camera, at least one camera may be selected from the other front cameras, and if the camera corresponding to the preview image currently displayed is the rear camera, at least one camera may be selected from the other rear cameras.

In an embodiment, the electronic device 10 may select at least one camera, by considering the current folding state of the electronic device 10. For example, currently in the folded state, the electronic device 10 may select at least one camera, from cameras (e.g., the second front camera 542 and the third front cameras 543) which may be effectively used for photographing if the electronic device 10 is to be unfolded. For example, currently in the flat state, the electronic device 10 may select at least one camera, from cameras (e.g., the first front camera 541) which may be effectively used for photographing if the electronic device 10 is to be folded.

The electronic device 10 may select at least one camera further based on display properties (e.g., a display size and supported resolutions).

The at least one camera selected in operation 630 may be activated in response to the folding/unfolding of the electronic device 10. For example, if the second front camera 542 is selected in operation 630, the electronic device 10 may activate the selected second front camera 542 in response to the unfolding of the electronic device 10, and display a preview image of the selected second front camera 542.

In operation 640, the electronic device 10 may identify whether folding or unfolding of the electronic device 10 is detected. For example, the electronic device 10 may identify that the folding of the electronic device 10 is detected, by identifying that the state of the electronic device 10 is changed from the flat state (or the intermediate state) to the folded state. For example, by identifying that the state of the electronic device 10 is changed from the folded state to the flat state, it may identify that the unfolding of the electronic device 10 is detected. The electronic device 10 may identify whether the folding or the unfolding is detected, using the sensor information of the sensor module 176. In an embodiment, the electronic device 10 may identify the state change of the electronic device 10. In an embodiment, the electronic device 10 may identify the state change of the electronic device 10 from a first state (e.g., the folded state) to other state (e.g., the intermediate state, or the flat state) than the first state. In an embodiment, if identifying the folding state change of the electronic device 10, the electronic device 10 may identify that the folding or the unfolding is detected.

In operation 650, the electronic device 10 may display a second preview image corresponding to the selected camera.

In an embodiment, the electronic device 10 displaying the second preview image may be in the unfolded state.

In an embodiment, the electronic device 10 may display the second preview image corresponding to the selected camera on a corresponding display.

In an embodiment, the electronic device 10 may activate the selected camera and the display corresponding to the selected camera, and display the second preview image corresponding to the activated camera on the activated display. In an embodiment, the electronic device 10 may deactivate the camera corresponding to the first preview image and the display displaying the first preview image.

For example, if the selected camera is the second front camera (e.g., the second front camera 542), the electronic device 10 may activate the second front camera 542 and the second front camera 542 corresponding to the second front camera 542, and display the second preview image corresponding to the second front camera 542 on the second display 552.

In an embodiment, the electronic device 10 may display the second preview image corresponding to the second front camera 542, based on a specific field of view included in the field of view range corresponding to the second front camera 542. For example, if the second front camera 542 corresponds to the second field of view (e.g., 60 degrees through 90 degrees) for displaying the preview image in the wide-angle mode, the electronic device 10 may display the second preview image based on a 75-degree field of view. In an embodiment, in determining the specific field of view within the second field of view range, the electronic device 10 may consider properties (e.g., a size, a resolution) of the second display 552 corresponding to the second front camera 542.

In an embodiment, the electronic device 10 may determine an aspect ratio (e.g., 16:9, 4:3, 1:1, 3:4, 9:16, Full) associated with the displaying of the second preview image, and display the second preview image based on the determined aspect ratio.

In an embodiment, the electronic device 10 may determine the aspect ratio of the preview image based on an analysis result of at least one object (e.g., arrangement information of at least one object) displayed in the first preview image, or the user preference information stored in the memory 130.

In an embodiment, the electronic device 10 may determine the aspect ratio of the second preview image further based on the size or the ratio of the width and height of the display corresponding to the selected camera.

In operation 660, the electronic device 10 may obtain a captured image.

In an embodiment, in response to a user input for obtaining the captured image, the electronic device 10 may acquire the captured image based on the displayed second preview image. The user input for obtaining the captured image may be a user input to a graphic user interface (e.g., a photographing button) displayed on the second display 552 or a physical interface disposed on the foldable housing 500. In an embodiment, the graphic user interface may be displayed on the first display 551 and the second display 552 before and after the folding or the unfolding of the electronic device 10 is detected. However, if the folding or the unfolding of the electronic device 10 is detected, a display position of the graphic user interface may be changed. For example, if the folding or the unfolding of the electronic device 10 is detected, the photographing button displayed at a lower center of the first display 551 may be displayed at a left bottom of the second display 552, to make it close to a user's hand (e.g., a left hand) holding the electronic device 10.

In an embodiment, even with no explicit user input for obtaining the captured image, the electronic device 10 may automatically obtain the captured image, if a preset time passes after the folding or the unfolding is detected (or after the second preview image is displayed).

In yet an embodiment, if receiving the user input for acquiring the captured image before detecting the folding or the unfolding, the electronic device 10 may acquire the captured image if a preset time passes after the folding or the unfolding is detected (or after the second preview image is displayed).

Figure 7:
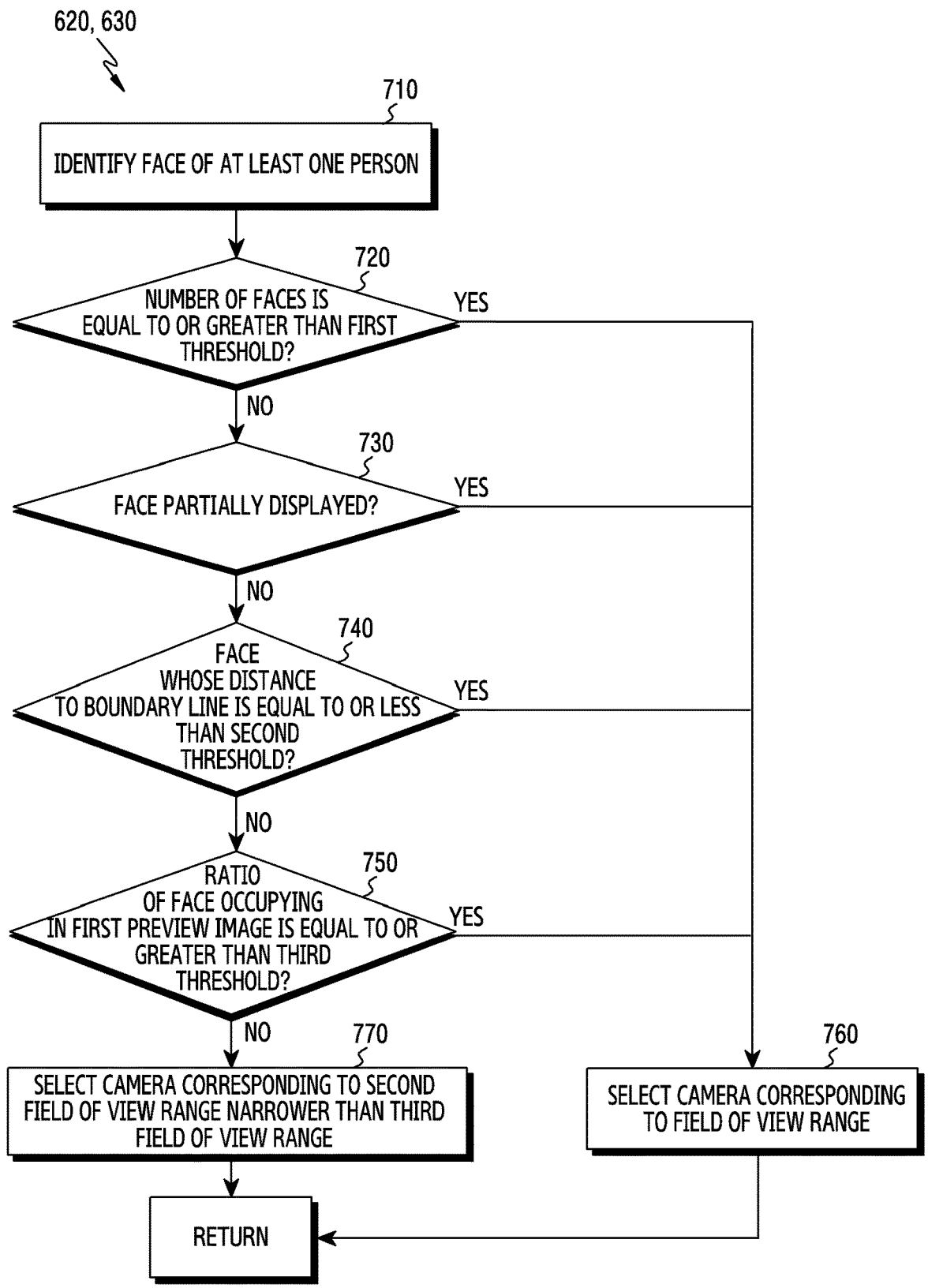
FIG. 7 is a flowchart illustrating an example operation of an electronic device for analyzing at least one object displayed in a first preview image, and selecting at least one camera based on an analysis result according to various embodiments.
Figure 8:
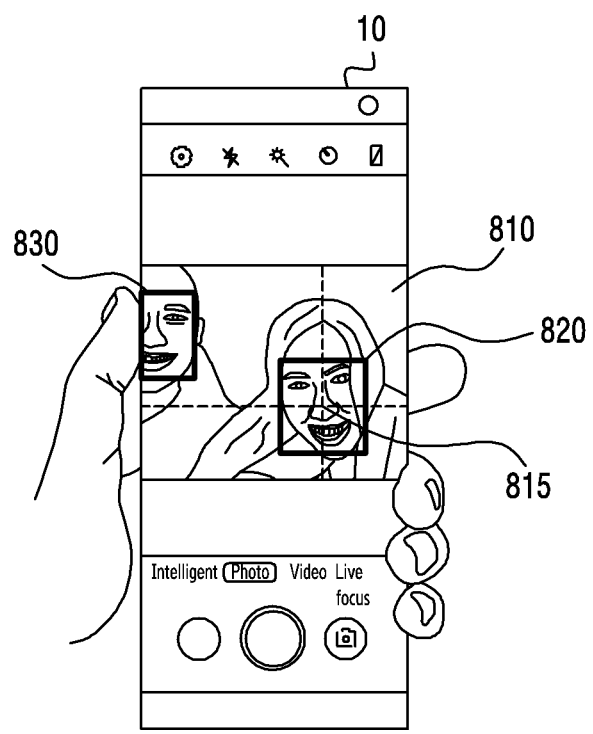
FIG. 8 is a diagram illustrating an example in which an electronic device analyzes at least one object displayed in a first preview image according to various embodiments.

FIG. 7 is a flowchart illustrating an example operation of an electronic device (e.g., the electronic device 10) for analyzing at least one object displayed in a first preview image, and selecting at least one camera based on an analysis result according to various embodiments. FIG. 8 is a diagram illustrating an example in which an electronic device (e.g., the electronic device 10) analyzes at least one object displayed in a first preview image according to various embodiments. FIG. 7 and FIG. 8 may be described with reference to the configurations of the electronic device 10 of FIG. 1 through FIG. 5.

Operations disclosed in FIG. 7 may be detailed operations of operations 620 and 630 disclosed in FIG. 6.

The operations disclosed in FIG. 7 may be performed if the first preview image is the preview image corresponding to the front camera (e.g., the first front camera 541).

In operation 710, the electronic device 10 may identify a face of at least one person. The electronic device 10 may identify that the first preview image includes at least one person's face, and determine at least one of the number, shape, size, or region ratio of the face of the at least one person whose presence is identified. For example, referring to FIG. 8, the electronic device 10 may identify faces 820 and 830 of two persons included in a first preview image 810.

In an embodiment, the electronic device 10 may identify the face of the person (e.g., the face A 820) fully included in the first preview image, or identify the face of the person (e.g., the face B 830) partially included in the first preview image. For example, if the electronic device 10 identifies a specific face fully included in the first preview image, and then a part of the specific face is cut off on the screen of the first preview image, it may identify that the specific face is partially included in the first preview image. As another example, by identifying a part (e.g., one eye) of a feature point (e.g., an eyebrow, an eye, a nose, an ear) which is considered to be included generally in the face, the electronic device 10 may identify the face partially included in the first preview image.

In operation 720, the electronic device 10 may determine whether the number of the faces of the at least one identified person is equal to or greater than a first threshold. In an embodiment, the first threshold may be 3. For example, if four persons' faces are included in the first preview image, the electronic device 10 may identify that the number of the identified faces of the at least one person is equal to or greater than the first threshold.

If the number of the faces of the at least one identified person is equal to or greater than the first threshold (YES in operation 720), the electronic device 10 may select the camera (e.g., the third front camera 543) corresponding to the third field of view range, in operation 760. In an embodiment, the third field of view range may correspond to a field of view range for displaying the preview image in the ultra-wide-angle mode.

If the number of the faces of the at least one identified person is less than the first threshold (NO in operation 720), the electronic device 10 may identify whether there is a person's face partially displayed, in operation 730. For example, it may identify whether the at least one person's face identified includes the face of the person whose part is cut off by the margin of the first preview image.

If there is a person's face partially displayed (YES in operation 730), the electronic device 10 may select the camera corresponding to the third field of view, in operation 760.

If there is no person's face partially displayed (NO in operation 730), the electronic device 10 may determine whether there is a person face whose distance to a boundary line of the first preview image is equal to or less than a second threshold, in operation 740. For example, the electronic device 10 may determine whether there is a face of a person close to the boundary of the first preview image, among the faces fully displayed. Referring to FIG. 8, the electronic device 10 may determine a closed curve corresponding to an outline of the person's face 820 fully displayed and a center 815 of the closed curve, and determine distances from the center 815 of the determined closed curve to boundary lines (e.g., a left boundary line, a right boundary line, a lower boundary line, an upper boundary line) of the first preview image.

If there is a face of a person whose distance to the boundary line is equal to or less than the second threshold (YES in operation 740), the electronic device 10 may select the camera corresponding to the third field of view range, in operation 760.

If there is no face of the person whose distance to the boundary line is equal to or less than the second threshold (NO in operation 740), the electronic device 10 may identify whether a ratio of a region occupied by the face of the at least one identified person in the first preview image (e.g., a ratio of the entire region of the first preview image and the region of the at least one person's face identified) is equal to or greater than a third threshold, in operation 750.

If the ratio of the region is equal to or greater than the third threshold (YES in operation 750), the electronic device 10 may select the camera corresponding to the third field of view range, in operation 760.

If the ratio of the region is less than the third threshold (NO in operation 750), the electronic device 10 may select the camera (e.g., the second front camera 542) corresponding to the second field of view range, in operation 770. In an embodiment, the second field of view range may correspond to a relatively narrower field of view range than the third field of view range. In an embodiment, the second field of view range may correspond to the field of view range for displaying the preview image in the wide-angle mode.

According to the embodiment disclosed in FIG. 7, the electronic device 10 may select the camera to be activated in response to the folding or the unfolding of the electronic device 10, based on the analysis result of the face of the at least one person included in the first preview image.

The operations disclosed in FIG. 7 may be exchanged, and some operation may be omitted. For example, the electronic device 10 may perform operation 730 before operation 720, may omit operation 750 after conducting operation 740, and may perform operation 770.

Figure 9:
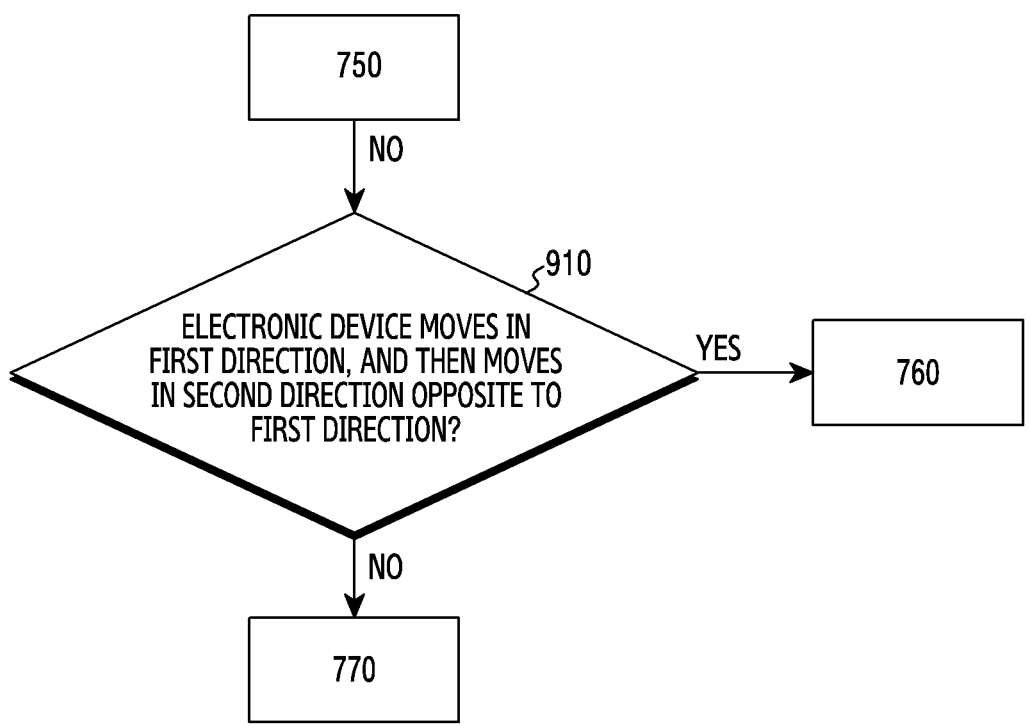
FIG. 9 is a flowchart illustrating an example operation of an electronic device according to various embodiments.

FIG. 9 is a flowchart illustrating an example operation of an electronic device (e.g., the electronic device 10) according to various embodiments. FIG. 9 may be described with reference to the configurations of the electronic device 10 of FIG. 1 through FIG. 5.

In the descriptions of operation 750 of FIG. 7, if the ratio of the region occupied by the at least one identified person's face in the first preview image is less than the third threshold, the camera corresponding to the second field of view range may be selected in operation 770 as aforementioned.

FIG. 9 describes the operation which may be additionally performed, before the camera corresponding to the second field of view range is selected, if the ratio of the region occupied by the at least one identified person's face in the first preview image is less than the third threshold.

In an embodiment, if the ratio of the region occupied by the at least one identified person's face in the first preview image is less than the third threshold, the electronic device 10 may identify that the electronic device 10 has moved in a first direction, and then moved in a second direction which is opposite to the first direction, in operation 910. For example, while the first preview image is displayed, the electronic device 10 may identify whether the electronic device 10 has moved in the first direction, and then moved in the second direction within a designated time.

In an embodiment, while the first preview image is displayed, the electronic device 10 may also identify whether the electronic device 10 has moved in the first direction at a first speed, and then moved in the second direction at a second speed within the designated time.

In an embodiment, if the first direction is the direction of gravity (z− direction), the second direction may be an opposite direction (z+ direction) to the direction of gravity.

In an embodiment, provided that a direction toward the user in the electronic device 10 is the x− direction and a direction away from the user is the x+ direction, the first direction may be the y+ direction perpendicular to the z and x axes, and the second direction may be y− direction.

The movement of the electronic device in the first direction and the second direction is identified in operation 910 to identify whether the user wants the camera shooting with a wider field of view. In general, if a plurality of subjects (e.g., a plurality of persons) is captured at a relatively narrow field of view, some of the subjects may not be included in the screen frequently. If the electronic device 10 is moved in a specific direction (e.g., the first direction) to include the some subject in the screen, part of the other subject included in the screen before the movement may not be included in the screen. In this case, the user generally moves the electronic device 10 in the opposite direction (e.g., the second direction) again, and as a result, the electronic device 10 may perform operation 760 based on determination that the electronic device is moved in the first direction and then moved in the second direction, in operation 910.

In an embodiment, the electronic device 10 may select the camera corresponding to the third field of view range in operation 760. For example, if the electronic device 10 is moved in the first direction and then in the second direction, it may be determined that it is impossible to fulfill the wider field of view shooting as desired by the user with the currently activated camera and display. Hence, the electronic device 10 may select the camera (e.g., the third front camera 543) corresponding to the third field of view range, which is the relatively wide field of view, based on the determination that the user wants the camera shooting with the wider field of view.

In an embodiment, in operation 770, the electronic device 10 may select the camera corresponding to the second field of view range. For example, if not identifying that the electronic device 10 is moved in the first direction and then in the second direction (NO in operation 910), the electronic device 10 may select the second front camera 542 corresponding to the second field of view range which is the narrower field of view range than the third field of view range.

In an embodiment, it is illustrated that operation 910 is performed after operation 750 is conducted, but it may be performed between any one of operation 710 and operation 720, operation 720 and operation 730, operation 730 and operation 740, and operation 740 and operation 750.

Figure 10:
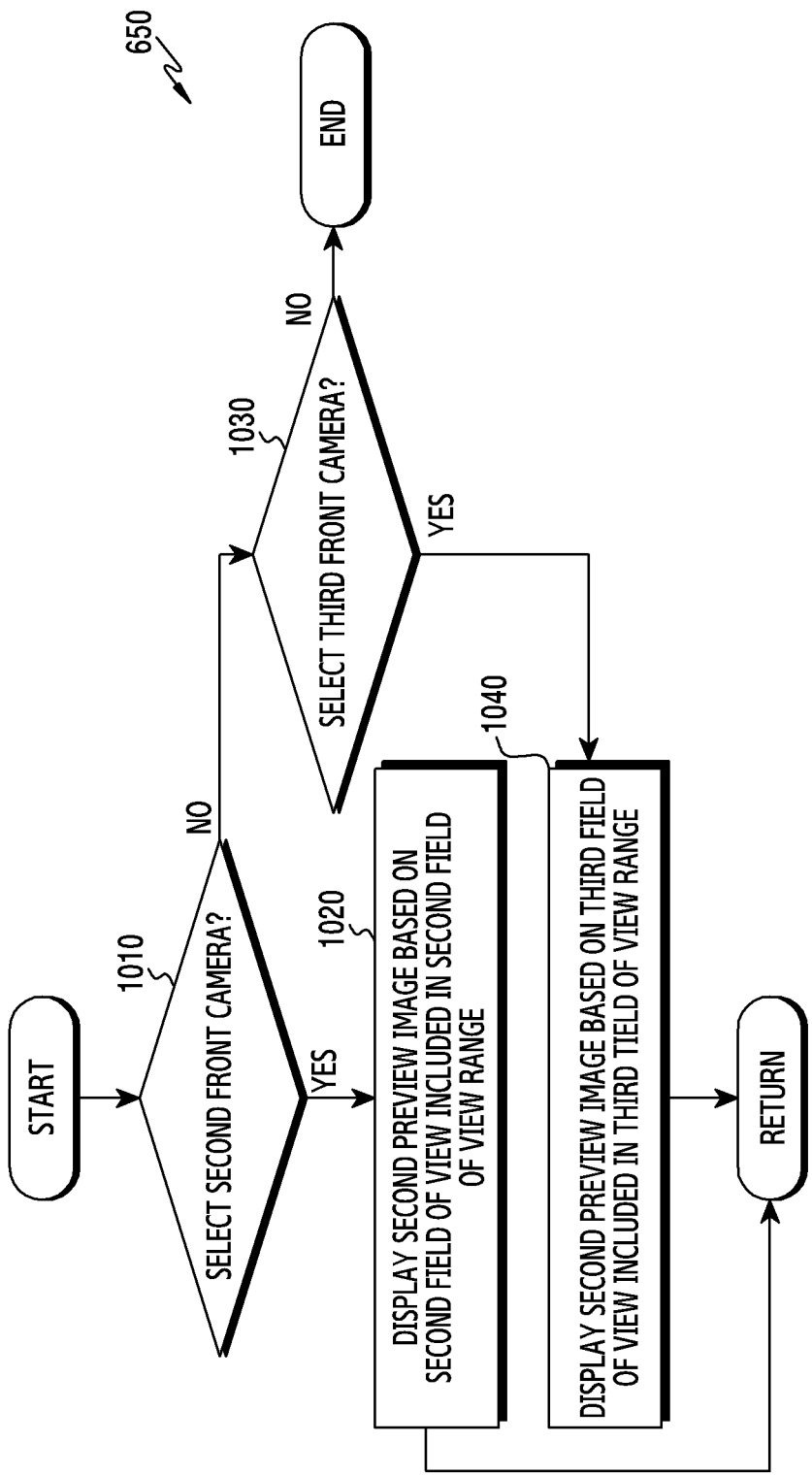
FIG. 10 is a flowchart illustrating an example operation of an electronic device for displaying a second preview image corresponding to a selected camera according to various embodiments.

FIG. 10 is a flowchart illustrating an example operation of an electronic device (e.g., the electronic device 10) for displaying a second preview image corresponding to a selected camera according to various embodiments. FIG. 10 may be described with reference to the configurations of the electronic device 10 of FIG. 1 through FIG. 5.

The operations disclosed in FIG. 10 may be detailed operations of operation 650 disclosed in FIG. 6.

The electronic device 10 may identify whether the second front camera 542 is selected, in operation 1010.

If the second front camera 542 is selected (YES in operation 1010), the electronic device 10 may display the second preview image based on a second field of view included in the second field of view range in operation 1020. For example, if the second field of view range corresponds to 60 degrees through 90 degrees, the electronic device 10 may display the second preview image on the second display 552 based on the 75-degree field of view.

In an embodiment, the second field of view range may correspond to the field of view range for displaying the preview image in the wide-angle mode.

If the second front camera 542 is not selected (NO in operation 1010), the electronic device 10 may determine whether the third front camera 543 is selected in operation 1030. If the third front camera 543 is not selected (NO in operation 1030), the electronic device 10 may terminate the corresponding algorithm. If the third front camera 543 is selected (YES in operation 1030), the electronic device 10 may display the second preview image based on a third field of view included in the third field of view range, in operation 1040. For example, if the third field of view range corresponds to 90 degrees through 180 degrees, the electronic device may display the second preview image on the second display 552 based on the 120-degree field of view.

In an embodiment, the third field of view range may correspond to the field of view range for displaying the preview image in the ultra-wide-angle mode.

Figures 11A, 11B:
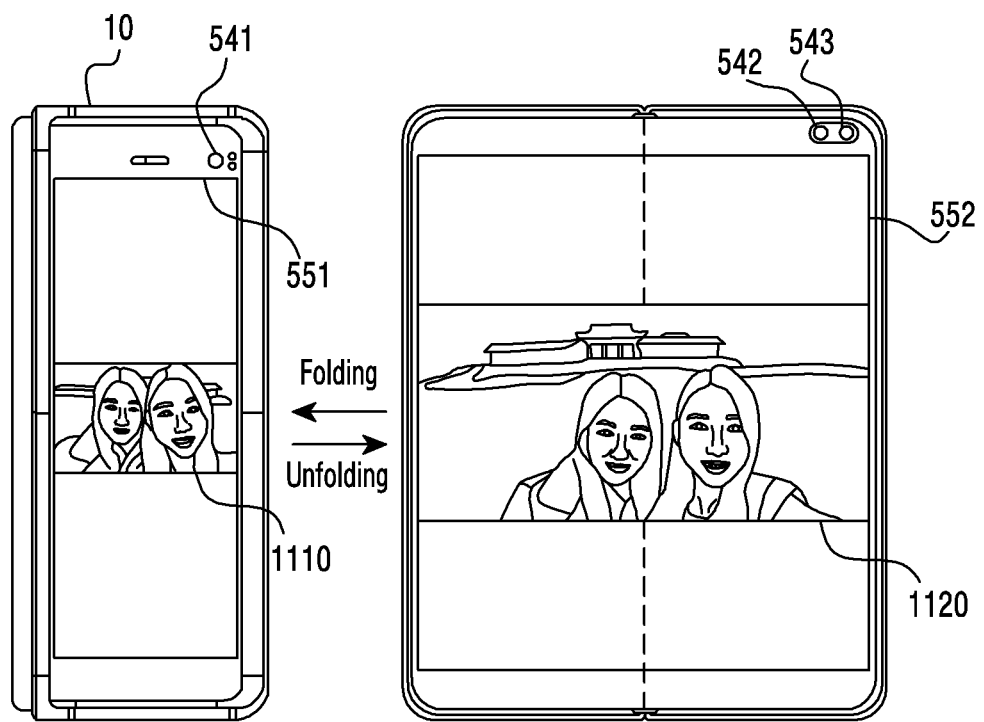
FIGS. 11A and 11B are diagrams illustrating an electronic device according to various embodiments.

FIGS. 11A and 11B are diagrams illustrating an electronic device 10 according to various embodiments.

FIG. 11A illustrates the electronic device in the folded state, and FIG. 11B illustrates the electronic device in the flat (e.g., unfolded) state.

Referring to FIG. 11A, the electronic device 10 may display a first preview image 1110 on the first display 551. The first preview image 1110 may be a preview image of the first front camera 541. The first front camera 541 may support the first field of view range or correspond to the first field of view range.

In an embodiment, the electronic device 10 may select at least one camera, based on an analysis result of at least one object included in the first preview image 1110. For example, based on distances between faces of two persons included in the first preview image 1110 and boundary lines of the first preview image 1110, the electronic device 10 may select the third front camera 543 supporting the relatively wider field of view range, among the second front camera 542 and the third front cameras 543.

Referring to FIG. 11B, the electronic device 10 may detect unfolding. In response to detecting the unfolding, the electronic device 10 may activate the selected third front camera 543, and display a second preview image 1120 corresponding to the activated third front camera 543. Hence, even without an explicit user input, the electronic device 10 may provide the user with the preview image of the camera supporting the wider field of view range, in response to the unfolding of the electronic device 10.

Figure 12:
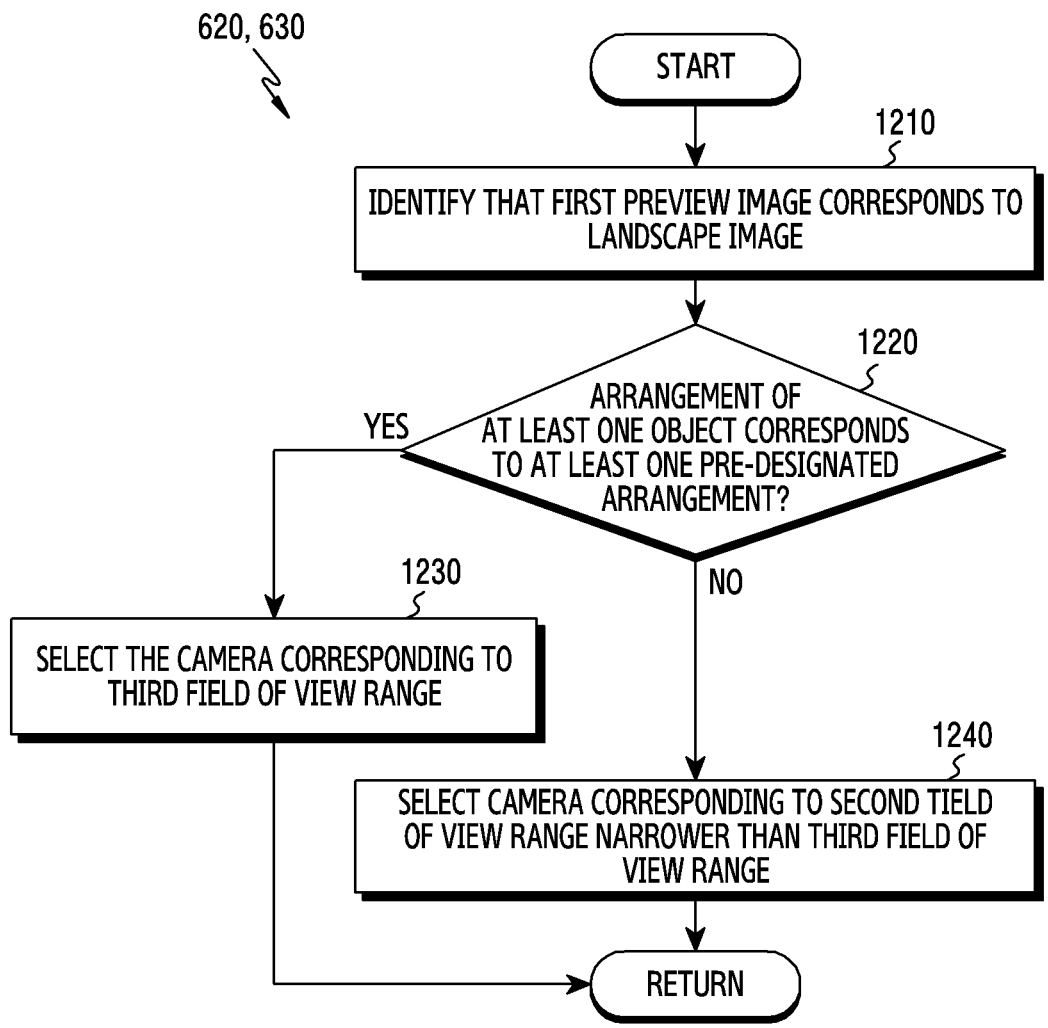
FIG. 12 is a flowchart illustrating an example operation of an electronic device for analyzing at least one object displayed in a first preview image, and selecting at least one camera based on an analysis result according to various embodiments.

FIG. 12 is a flowchart illustrating an example operation of an electronic device (e.g., the electronic device 10) for analyzing at least one object displayed in a first preview image, and selecting at least one camera based on an analysis result according to various embodiments. FIG. 12 may be described with reference to the configurations of the electronic device 10 of FIG. 1 through FIG. 5.

Operations disclosed in FIG. 12 may be detailed operations of operations 620 and 630 disclosed in FIG. 6.

The operations disclosed in FIG. 12 may be performed if the first preview image is a preview image corresponding to the first rear camera 341.

In operation 1210, the electronic device 10 may identify that the first preview image corresponds to a landscape image.

For example, if the electronic device 10 may not identify at least one person's face in the first preview image, or if a size of at least one person's face included in the first preview image is smaller than a reference value, the electronic device 10 may identify that the first preview image corresponds to the landscape image.

For example, the electronic device 10 may determine a type (e.g., mountain, sea, tree, building) of a main subject (e.g., the largest subject) included in the first preview image, and identify based on the determined object type that the first preview image corresponds to the landscape image.

In operation 1220, the electronic device 10 may identify whether an arrangement of at least one object included in the first preview image corresponds to at least one pre-designated (e.g., specified) arrangement.

For example, if the main subject (or a subject over a specific size) included in the first preview image is arranged symmetrically (e.g., bilaterally symmetrically, vertically symmetrically), the electronic device 10 may determine that it corresponds to at least one pre-designated arrangement.

As another example, if a part of the main subject included in the first preview image is cut out and invisible in the first preview image, the electronic device 10 may determine that it corresponds to at least one pre-designated arrangement.

As yet another example, if a length of a specific line or a size of a specific region calculated by the arrangement of at least one object included in the first preview image exceeds a designated value, the electronic device 10 may determine that it corresponds to at least one pre-designated arrangement. For example, if a horizontal line or a horizon exceeding a designated value is included in the first preview image, the electronic device 10 may determine that it corresponds to at least one predetermined arrangement. As another example, if the first preview image includes trees arranged in a row, and a line connecting top portions of the trees has a specific slope over a specific length, the electronic device 10 may determine that the at least one object included in the first preview image corresponds to at least one pre-designated arrangement.

If the arrangement of the at least one object included in the first preview image corresponds to the at least one pre-designated arrangement (YES in operation 1220), the electronic device 10 may select the camera corresponding to the third field of view range in operation 1230. For example, the electronic device 10 may select the third rear camera 343 corresponding to the third field of view range.

If the arrangement of the at least one object included in the first preview image does not correspond to the at least one pre-designated arrangement (NO in operation 1220), the electronic device 10 may select the camera corresponding to the second field of view range in operation 1240. For example, the electronic device 10 may select the first rear camera 341 corresponding to the first preview image as it is.

Figures 13A, 13B:
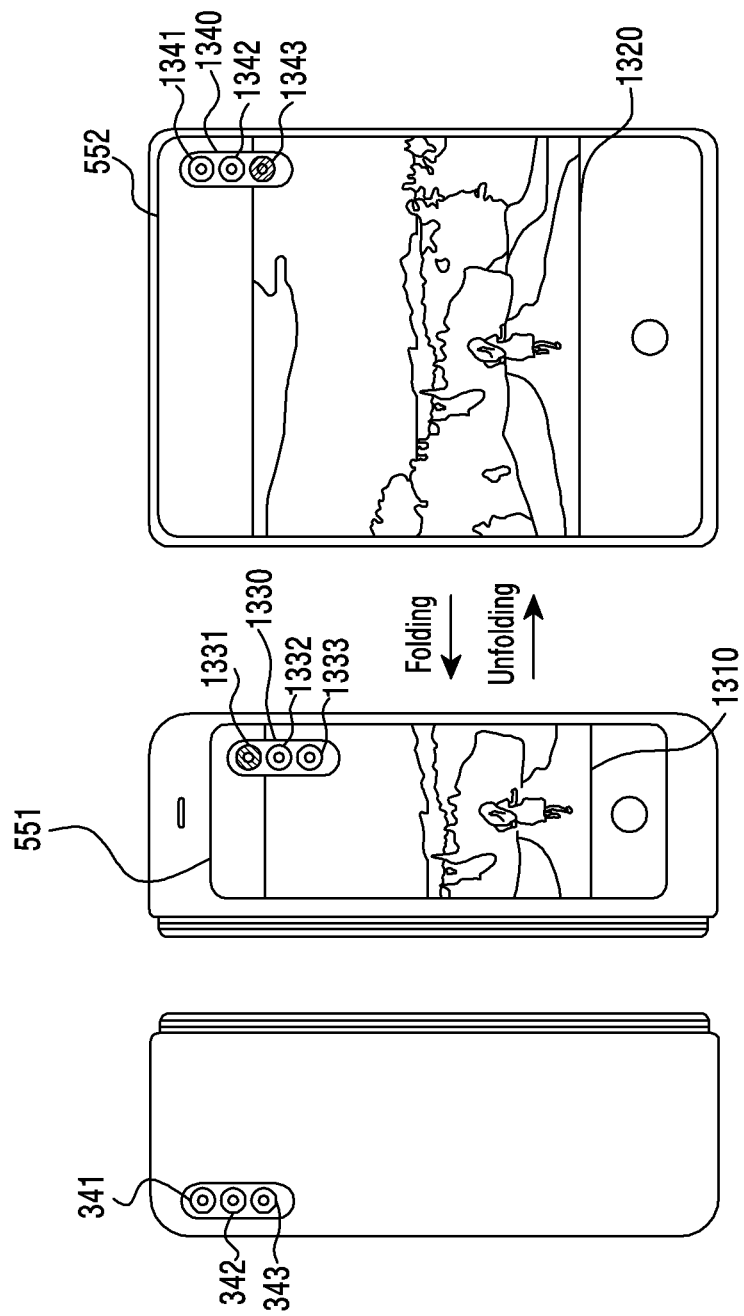
FIGS. 13A and 13B are diagrams illustrating an electronic device according to various embodiments.

FIGS. 13A and 13B are diagrams illustrating an electronic device 10 according to various embodiments.

FIG. 13A illustrates the electronic device of the folded state from various angles, and FIG. 13B illustrates the electronic device of the flat (e.g., unfolded) state.

Referring to FIG. 13A, the electronic device 10 including the first rear camera 341, the second rear camera 342, and the third rear camera 343 may display a preview image 1310 on the first display 551. The first preview image 1310 may be a preview image of the first rear camera 341. The first rear camera 341 may correspond to the second field of view range.

In an embodiment, the electronic device 10 may display a first indicator 1330 indicating which camera corresponds to the currently displayed preview image, by overlapping at least a part of the first preview image 1310, on the first display 551. The first indicator 1330 may include objects (a first object 1331 corresponding to the first rear camera 341, a second object 1332 corresponding to the second rear camera 342, and a third object 1333 corresponding to the third rear camera 343) indicating the activation or deactivation state of the first rear camera 341, the second rear camera 342, and the third rear camera 343. Since the preview image currently displayed on the first display 551 corresponds to the first rear camera 341, the first object 1331 corresponding to the first rear camera 341 may be displayed to be distinguished (e.g., color, shape, and shade) from the second object 1332 corresponding to the second rear camera 342, and the third object 1333 corresponding to the third rear camera 343.

In an embodiment, the electronic device 10 may identify that the first preview image 1310 corresponds to a landscape image. Based on determining that an object (a road 1311) included in the first preview image 1310 is arranged bilaterally symmetrically, the electronic device 10 may identify that the arrangement of the at least one object included in the first preview image 1310 corresponds to at least one pre-designated arrangement. Hence, the electronic device 10 may select the third rear camera 343 corresponding to the relatively wider field of view range.

Referring to FIG. 13B, in response to the unfolding of the electronic device 10, the electronic device 10 may display a second preview image 1320 on the second display 552. The second preview image 1320 may be a preview image of the selected third rear camera 343. The third rear camera 343 may correspond to the third field of view range, which is the wider field of view range than the second field of view range.

In an embodiment, the electronic device 10 may display a second indicator 1340 indicating which camera corresponds to the currently displayed preview image, by overlapping at least a part of the second preview image 1320, on the second display 552. The second indicator 1340 may include objects (a first object 1341 corresponding to the first rear camera 341, a second object 1342 corresponding to the second rear camera 342, and a third object 1343 corresponding to the third rear camera 343) indicating the activation or deactivation state of the first rear camera 341, the second rear camera 342, and the third rear camera 343, after the unfolding of the electronic device 10. Since the preview image currently displayed on the second display 552 corresponds to the third rear camera 343, the third object 1343 corresponding to the third rear camera 343 may be displayed to be distinguished from the first object 1341 corresponding to the first rear camera, and the second object 1342 corresponding to the second rear camera.

Figure 14:
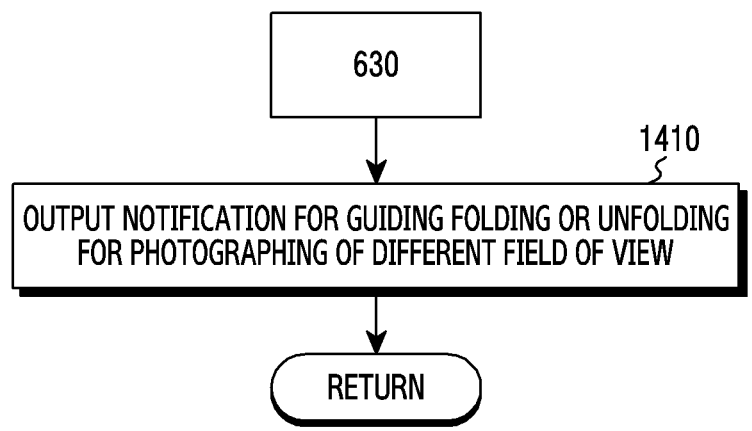
FIG. 14 is a flowchart illustrating an example operation of an electronic device for outputting a guide notification according to various embodiments.

FIG. 14 is a flowchart illustrating an example operation of an electronic device (e.g., the electronic device 10) for outputting a guide notification according to various embodiments. FIG. 14 may be described with reference to the configurations of the electronic device 10 of FIG. 1 through FIG. 5.

The operation disclosed in FIG. 14 may be performed after operation 630 disclosed in FIG. 6 is conducted.

In an embodiment, in operation 1410, the electronic device 10 may output a notification for guiding the folding or the unfolding for the photographing with a different field of view. For example, the electronic device 10 may output the notification for guiding the unfolding of the electronic device 10 for the photographing with a wider field of view, and the electronic device 10 may output the notification for guiding the folding for the photographing with a narrower field of view.

In an embodiment, the electronic device 10 may display the notification for guiding the unfolding in the form of a pop-up window on the first display 551, or may output to a speaker (e.g., the sound output device 155). In an embodiment, the electronic device 10 may display the notification for guiding the folding in the form of a pop-up window on the second display 552, or may output to the speaker (e.g., the sound output device 155).

In an embodiment, the electronic device 10 may determine whether to output the notification for guiding the folding (or the unfolding). The electronic device 10 may determine whether to output the notification for guiding the folding (or the unfolding,) depending on the selected camera. For example, if the selected camera may be used to capture a currently displayed subject even without folding (or unfolding) the electronic device 10, the electronic device 10 may not output the notification for guiding the folding (or the unfolding). As another example, if the camera is not changed, the electronic device 10 may not output the notification for guiding the folding (or the unfolding).

In an embodiment, the electronic device 10 may output the notification for guiding the folding (or the unfolding) at a designated timing. While the first preview image is being displayed, if a time for which a user input for the photographing is not received is longer than a designated time, the electronic device 10 may output the notification for guiding the folding (or the unfolding).

In an embodiment, the electronic device 10 may output the notification for guiding the folding (or the unfolding) for a designated guide time.

In an embodiment, while the notification is outputted, if a user input for obtaining the captured image is detected based on the first preview image, the electronic device 10 may immediately remove the outputted notification.

Figure 15:
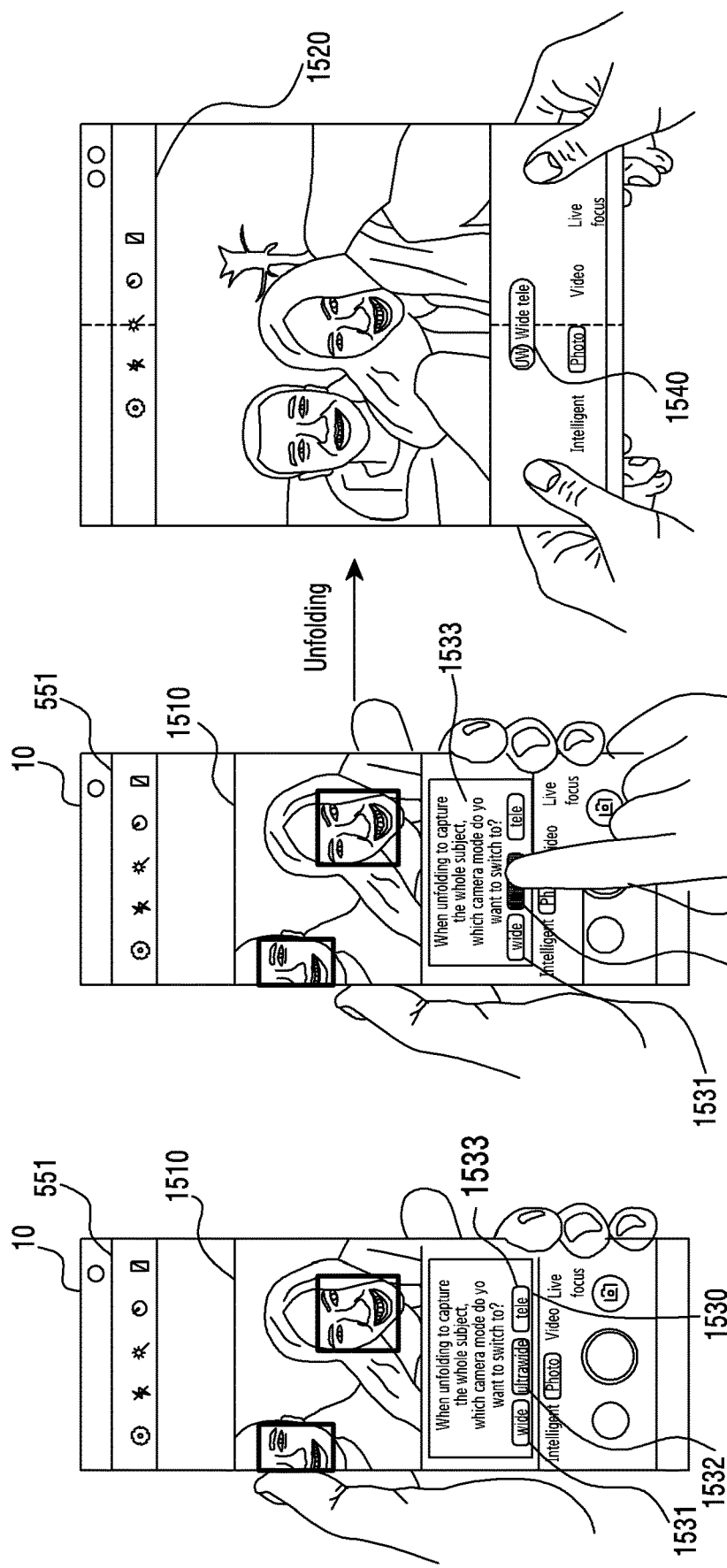
FIGS. 15A, 15B and 15C are diagrams illustrating examples in which an electronic device outputs a guide notification according to various embodiments.

FIGS. 15A, 15B and 15C are diagrams illustrating examples in which an electronic device 10 outputs a guide notification according to various embodiments.

Referring to FIG. 15A, the electronic device 10 may display a first preview image 1510 on the first display 551. The first preview image 1510 may correspond to the first front camera 541. The first front camera 541 may correspond to the first field of view range.

In an embodiment, the electronic device 10 may select the third front camera 543, based on an analysis result of at least one object included in the first preview image 1510. The selected third front camera 543 may be activated, in response to detecting the unfolding of the electronic device 10.

In an embodiment, the electronic device 10 may display an unfolding guide notification 1530 for guiding the unfolding of the electronic device 10 on the first display 551. The unfolding guide notification 1530 may include a plurality of objects. If the electronic device is unfolded, the plurality of the objects may correspond to a plurality of cameras respectively which may be used to capture a currently displayed subject. For example, a first object 1531 corresponding to the second front camera 542, a second object 1532 corresponding to the third front camera 543, and a third object 1533 corresponding to the fourth front camera (not shown) may be included in the unfolding guide notification 1530. The first object 1531, the second object 1532, and the third object 1533 each may include an indication for indicating the performance or the field of view range of its corresponding camera, and the photographing mode. For example, the first object 1531 may include a text object "wide" indicating the field of view range supported by the corresponding second front camera 542. For example, the second object 1532 may include a text object "ultra wide" indicating the field of view range supported by the corresponding third front camera 543. For example, the third object 1533 may include a text object "tele" indicating the field of view range supported by the corresponding first front camera 541.

In an embodiment, among the objects included in the unfolding guide notification 1530, the object corresponding to the camera selected based on the analysis result of the at least one object included in the first preview image 1510 may be displayed to be distinguished from the other objects. For example, if the third front camera 543 is selected, the electronic device 10 may display the second object 1532 corresponding to the third front camera 543, among the objects included in the unfolding guide notification 1530, to be distinguished from the other objects. The electronic device 10 may induce user selection for the second object 1532, by displaying the second object 1532 to be distinguished from the other objects.

Referring to FIG. 15B, the electronic device 10 may receive a user input to the unfolding guide notification 1530. For example, the electronic device 10 may receive a user input to the second object 1532, included in the unfolding guide notification 1530, displayed to be distinguished from the other objects. As another example, even if the second object 1532 is displayed to be distinguished from the other objects, the electronic device 10 may receive a user input to an object (e.g., the first object 1531) different from the second object 1532.

Although not depicted, if receiving no user input for the unfolding guide notification 1530 for a designated time after the unfolding guide notification 1530 is displayed, the electronic device 10 may remove the displayed unfolding guide notification 1530.

Referring to FIG. 15C, in response to detecting the unfolding of the electronic device 10, the electronic device 10 may display a second preview image 1520 on the second display 552. The second preview image 1520 may be a preview image of a camera (e.g., the third front camera 543) corresponding to an object (e.g., the second object 1532) for which the user input is received. The third front camera 543 may support the third field of view range which is the field of view range for displaying the preview image in the ultra-wide-angle mode, and the electronic device 10 may display the second preview image 1520 based on a specific field of view included in the third field of view range.

In an embodiment, the electronic device 10 may display a field of view switching menu 1540. The field of view switching menu 1540 may indicate that the second preview image 1520 is currently displayed based on the ultra-wide-angle mode. The field of view switching menu 1540 may further include icons for displaying the preview image at the field of view corresponding to the wide-angle mode or the telephoto mode. For example, if the icon for displaying the preview image at the field of view corresponding to the wide-angle mode is selected in the field of view switching menu 1540, the electronic device 10 may activate the second front camera 542, and display a preview image of the second front camera 542 on the second display 552.

Figure 16:
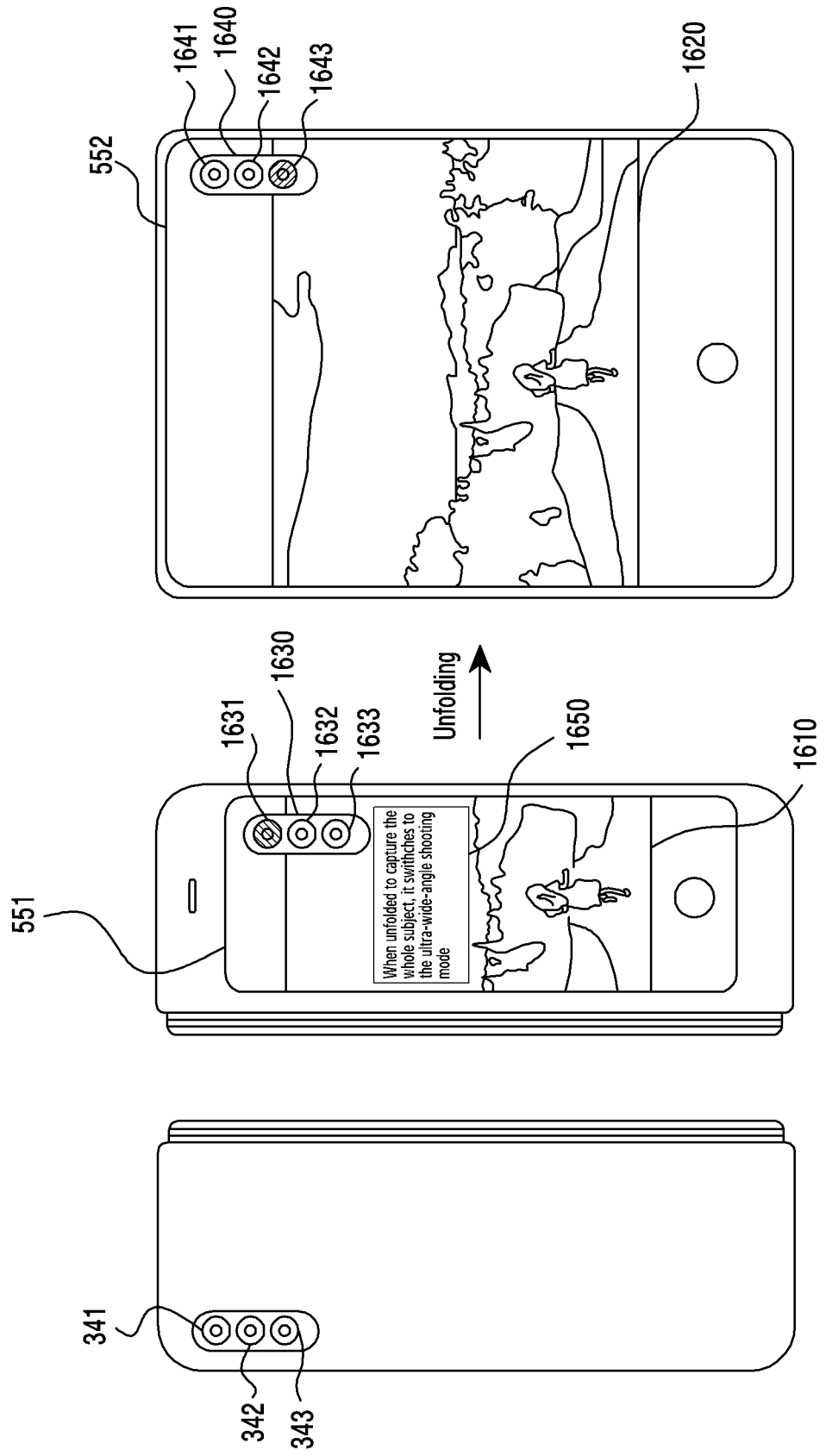
FIGS. 16A and 16B are diagrams illustrating examples in which an electronic device outputs a guide notification according to various embodiments.

FIGS. 16A and 16B are diagrams illustrating examples in which an electronic device 10 outputs a guide notification according to various embodiments.

FIG. 16A illustrates the electronic device 10 of the folded state from various angles, and FIG. 16B illustrates the electronic device 10 of the flat (e.g., unfolded) state.

Referring to FIG. 16A, the electronic device 10 may display a first preview image 1610 on the first display 551. The first preview image 1610 may be a preview image of the first rear camera 341. The first rear camera 341 may correspond to the second field of view range.

In an embodiment, the electronic device 10 may select the third rear camera 343, based on an analysis result of at least one object included in the first preview image 1610. The third rear camera 343 may correspond to the third field of view range which is the wider field of view range than the second field of view range.

In an embodiment, the electronic device 10 may display a first indicator 1630 indicating which camera corresponds to the currently displayed preview image, by overlapping at least a part of the first preview image 1610.

In an embodiment, the first indicator 1630 may include objects (a first object 1631 corresponding to the first rear camera 341, a second object 1632 corresponding to the second rear camera 342, and a third object 1633 corresponding to the third rear camera 343) indicating the activation or deactivation state of the first rear camera 341, the second rear camera 342, and the third rear camera 343. Since the preview image currently displayed on the first display 551 corresponds to the first rear camera 341, the first object 1631 corresponding to the first rear camera 341 may be displayed to be distinguished (e.g., color, shape, and shade) from the second object 1632 corresponding to the second rear camera 342, and the third object 1633 corresponding to the third rear camera 343.

In an embodiment, the electronic device may display an unfolding guide notification 1650. The unfolding guide notification 1650 may include a text or image object for suggesting the unfolding of the electronic device 10 to capture a whole subject. By displaying the unfolding guide notification 1650, the electronic device 10 may provide the user with field of view information which may be used to capture the subject after the electronic device 10 is unfolded. The unfolding guide notification 1650 may include information of the selected camera. For example, the unfolding guide notification 1650 may include a text object such as "When unfolded to capture the whole subject, it switches to the ultra-wide-angle shooting mode".

Referring to FIG. 16B, in response to the unfolding of the electronic device 10, the electronic device 10 may display a second preview image 1620 on the second display 552. The second preview image 1620 may be a preview image of the selected third rear camera 343.

In an embodiment, the electronic device 10 may display a second indicator 1640 indicating which camera corresponds to the currently displayed preview image, by overlapping at least a part of the second preview image 1620.

The second indicator 1640 may include objects (a first object 1641 corresponding to the first rear camera 341, a second object 1642 corresponding to the second rear camera 342, and a third object 1643 corresponding to the third rear camera 343) indicating the activation or deactivation state of the first rear camera 341, the second rear camera 342, and the third rear camera 343.

Figure 17:
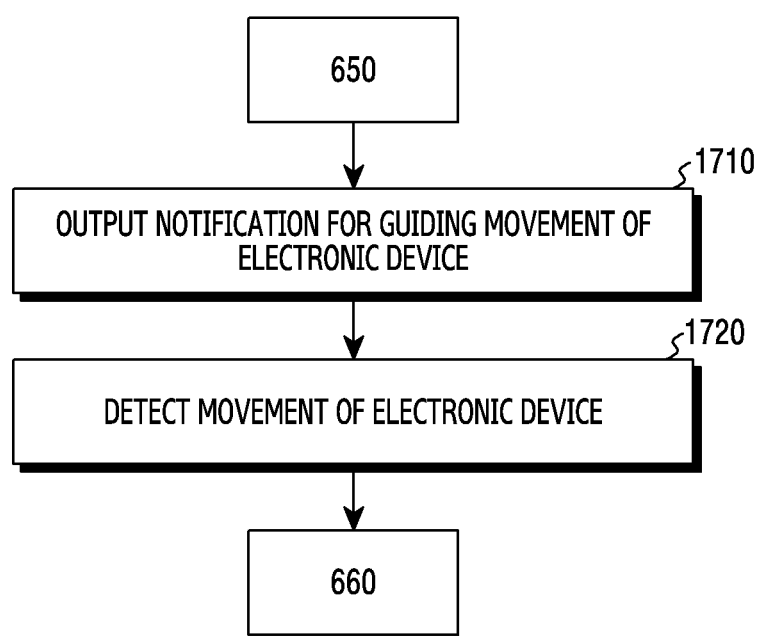
FIG. 17 is a flowchart illustrating an example operation of an electronic device for outputting a guide notification according to various embodiments.

FIG. 17 is a flowchart illustrating an example operation of an electronic device (e.g., the electronic device 10) for outputting a guide notification according to various embodiments.

The operations disclosed in FIG. 17 may be performed, after operation 650 disclosed in FIG. 6 is conducted, before operation 660 is conducted.

The operations disclosed in FIG. 17 may be performed if the first preview image and the second preview image correspond to the landscape image.

The operations disclosed in FIG. 17 may be performed, if at least one object included in the second preview image corresponds to at least one pre-designated arrangement (e.g., the arrangement illustrated in FIG. 12).

In an embodiment, in operation 1710, the electronic device 10 may output a notification for guiding the movement of the electronic device 10. For example, the electronic device 10 may output the notification guiding the electronic device 10 to move in a designated direction or rotate in order to create a panorama photo.

Figures 18A, 18B:
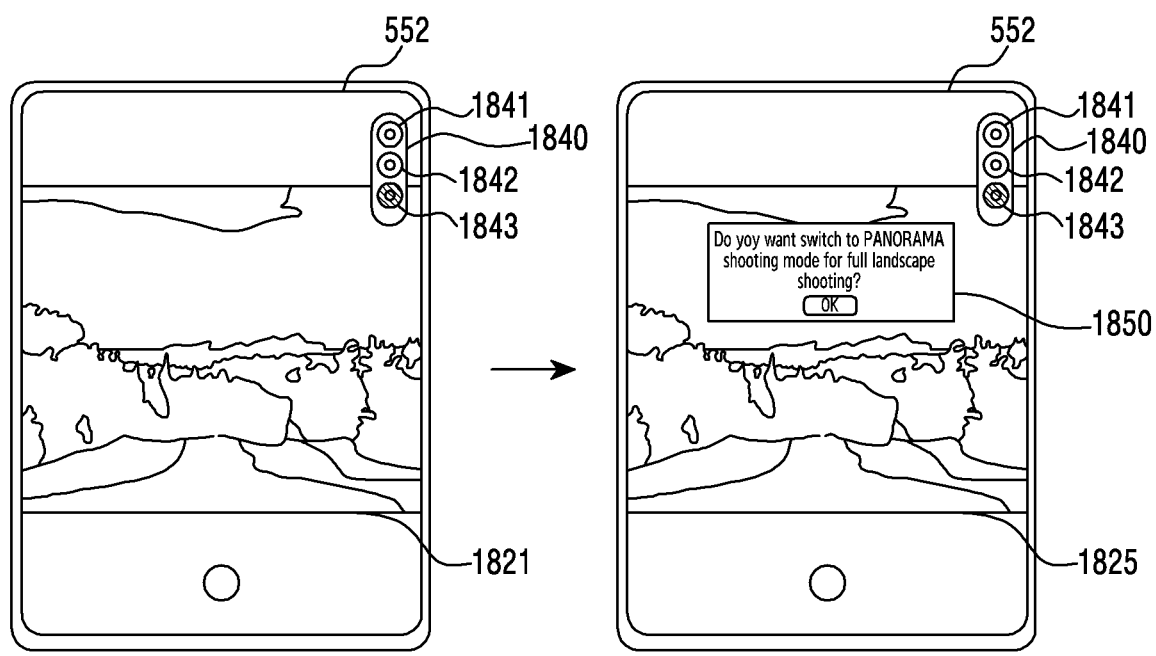
FIGS. 18A and 18B are diagrams illustrating examples in which an electronic device outputs a guide notification according to various embodiments.

Referring to FIG. 18B showing the electronic device of the flat state, the electronic device 10 may output a notification 1850 which suggests a panorama photographing mode for complete landscape photographing.

In an embodiment, the electronic device 10 may detect movement of the electronic device, in operation 1720. The electronic device 10 may detect the movement (or the rotation) of the electronic device suggested in operation 1710. The electronic device 10 may obtain image information for creating the panorama photo based on camera movement caused by the detected movement of the electronic device 10. The acquired image information may be used to create the panorama photo in operation 660.

FIGS. 18A and 18B are diagrams illustrating examples in which an electronic device 10 outputs a guide notification according to various embodiments.

FIG. 18A illustrates the electronic device 10 of the flat state of a first viewpoint, and FIG. 18B illustrates the electronic device 10 of the flat (e.g., unfolded) state of a second viewpoint.

In an embodiment, the electronic device 10 may select the third rear camera (e.g., the third rear camera 343) based on an analysis result of at least one object included in a first preview image 1821.

In an embodiment, referring to FIG. 18A, the electronic device 10 may display a second indicator 1840 indicating which camera corresponds to the currently displayed preview image, by overlapping at least a part of the first preview image 1821.

The second indicator 1840 may include objects (a first object 1841 corresponding to the first rear camera 341, a second object 1842 corresponding to the second rear camera 342, and a third object 1843 corresponding to the third rear camera 343) indicating the activation or deactivation state of the first rear camera (e.g., the first rear camera 34), the second rear camera (e.g., the second rear camera 342), and the third rear camera 343. Since the preview image currently displayed on the first display 551 corresponds to the third rear camera 343, the third object 1843 may be displayed to be distinguished (e.g., color, shape, and shade) from the first object 1841 and the second object 1842.

In an embodiment, referring to FIG. 18A, the electronic device 10 may determine the type (e.g., mountain, tree) of the main subject (e.g., the largest subject) included in the first preview image 1821, and identify that the first preview image 1821 corresponds to the landscape image based on the determined object type.

In an embodiment, referring to FIG. 18B, a panorama guide notification 1850 for the panorama photographing may be displayed. The panorama guide notification 1850 may include a text or image object suggesting movement of the electronic device 10 to capture a full landscape. The electronic device 10 may provide the user with panorama photographing information of the electronic device 10, by displaying the panorama guide notification 1850 to overlap the second preview image 1825.

Figure 19:
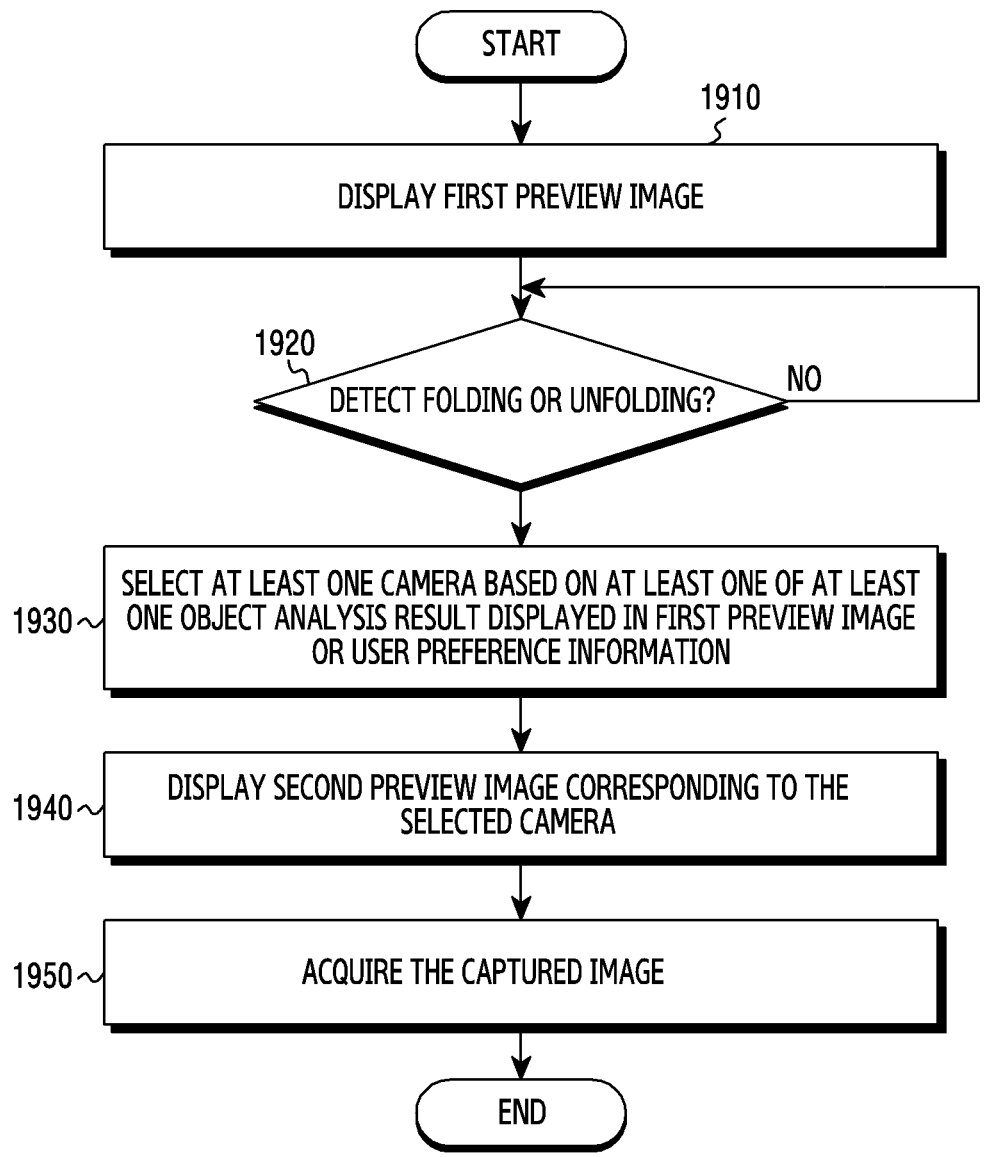
FIG. 19 is a flowchart illustrating an example operation of an electronic device according to various embodiments.

FIG. 19 is a flowchart illustrating an example operation of an electronic device (e.g., the electronic device 10) according to various embodiments.

Operations disclosed in FIG. 19 may be carried out by the electronic device 10, under the control of the processor 120 of FIG. 5. Hereafter, it is described that the electronic device 10 performs the operations disclosed in FIG. 19.

Operations 1910, 1920, 1940, and 1950 are substantially the same as or similar to operations 610, 640, 650, and 660 disclosed in FIG. 6, and accordingly their detailed descriptions may not be repeated here.

In an embodiment, in operation 1930, the electronic device 10 may select at least one camera based on at least one of the at least one object analysis result displayed in the first preview image or the user preference information.

In an embodiment, unlike the embodiment disclosed in FIG. 6, the electronic device 10 may perform the operation of selecting at least one camera, after the folding or the unfolding of the electronic device is detected.

In an embodiment, the electronic device 10 may select at least one camera based on the at least one object analysis result displayed in the first preview image. For example, if the number of faces of persons included in the first preview image is equal to or greater than the first threshold, the electronic device 10 may select the third front camera which supports the relatively wide field of view range, among the second front camera and the third front camera.

In an embodiment, the electronic device 10 may select at least one camera based on the user preference information stored in the memory 130.

For example, the electronic device 10 may select the second front camera 542, using information of the type of the first preview image (e.g., a portrait photo, a landscape photo), the number of times that the user takes photos of a specific type using the second front camera 542, and the number of times that the user takes photos of a specific type using the third front camera 543.

For example, the electronic device 10 may compare the number of times that the user takes photos using only the second front camera 542, and the number of times that the user takes photos using the second front camera 542 and the fourth front camera at the same time, and select the second front camera 542 and the fourth front camera (not shown) using the comparison result.

A computer readable recording medium may include a hard disk, a floppy disc, magnetic media (e.g., a magnetic tape), optical storage media (e.g., a compact disk (CD)-read only memory (ROM) or a digital versatile disk (DVD), magnetic-optic media (e.g., a floptical disc)), an internal memory, and so on. An instruction may include code created by a compiler or code executable by an interpreter. A module or program module according to various embodiments may include at least one or more of the aforementioned components, omit some of them, or further include other components. Operations performed by the module, the program, or another component, according to various embodiments may be carried out sequentially, in parallel, repeatedly or heuristically, or at least some operations may be executed in a different order or omitted, or other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:
1. A foldable electronic device comprising:
 a foldable housing including a first housing structure and a second housing structure;
 a sensor configured to provide sensor information used to identify a state of the foldable electronic device, wherein the state of the foldable electronic device includes a folded state and other states including an intermediate state and a flat state;
a first display disposed at a first side of the first housing structure;
a second display disposed at a second side of the first housing structure and a first side of the second housing structure, wherein the second side is an opposite side of the first side of the first housing structure and wherein the second display is configured to be folded in the folded state;
a first front camera positioned to capture images in a direction in which the first display faces;
a second front camera positioned to capture images in a direction in which the second display faces;
at least one processor; and
memory storing instructions that, when executed by the at least one processor, cause the foldable electronic device to:
  display, via the first display, a first preview image obtained by the first front camera while the foldable electronic device is in the folded state;
  while the first preview image obtained by the first front camera is displayed on the first display in the folded state, identify that the state of the foldable electronic device is changed from the folded state to the other states, based on the sensor information provided by the sensor; and
  in response to identifying that the state of the foldable electronic device is changed from the folded state to the other states, activate the second display to display a second preview image obtained by the second front camera.

2. The foldable electronic device of claim 1, wherein the instructions, when executed by the at least one processor, cause the foldable electronic device to:
  select the second front camera, based on an analysis result to at least one object included in the first preview image; and
  obtain a captured image based on the displayed second preview image.

3. The foldable electronic device of claim 2, wherein the analysis result to the at least one object comprises at least one of a shape of the at least one object, a size of the at least one object, a type of the at least one object, a number of the at least one object, or a ratio that a specific size of the at least one object occupies on a screen.

4. The foldable electronic device of claim 3, wherein the instructions, when executed by the at least one processor, cause the foldable electronic device to:
  based on at least one of a number of the at least one object of a specific type, a number of the at least one object of a specific type cut off by a screen, or a ratio that the at least one object of a specific type occupy in the screen, select one of the second front camera supporting a wider field of view range than a field of view of the first front camera, or a third camera supporting a field of view range which is narrower than a field of view range of the second front camera and wider than the field of view range of the first front camera.

5. The electronic device of claim 2, further comprising:
a third front camera provided with the second front camera at the first side of the second housing structure, and
wherein the instructions, when executed by the at least one processor, cause the foldable electronic device to:
  select one camera of the second front camera or the third camera based on a movement of the electronic device while the first preview image is displayed.

6. The electronic devices of claim 4, wherein the instructions, when executed by the at least one processor, cause the foldable electronic device to:
  based on selecting the second front camera or the third camera,
    determine at least one of the field of view of range of the second front camera or the third camera to be used to acquire the second preview image or an aspect ratio of the acquired second preview image to be displayed on the second display, based on an attribute of the second display.

7. The foldable electronic device of claim 6, wherein the attribute of the second display is at least one of a size or a resolution of the second display.

8. The foldable electronic device of claim 4, wherein the memory is configured to store at least one user preference information, and
  the instructions, when executed by the at least one processor, cause the foldable electronic device to:
    select a fourth camera corresponding to a special photographing effect, based on at least one of the analysis result to the at least one object or the at least one user preference information.

9. The foldable electronic device of claim 1, wherein the instructions, when executed by the at least one processor, cause the foldable electronic device to:
  before folding or unfolding of the electronic device is detected, output a notification suggesting folding or unfolding of the electronic device for photographing of a different field of view.

10. The electronic device of claim 9, wherein the notification comprises at least one object each corresponding to at least one camera included in a plurality of cameras, and
  the instructions, when executed by the at least one processor, cause the foldable electronic device to:
    output an object corresponding to a selected camera among the at least one object to be distinguished from other objects.

11. The foldable electronic device of claim 1, wherein the instructions, when executed by the at least one processor, cause the foldable electronic device to:
  deactivate the first display which displays the first preview image, in response to the state of the foldable electronic device being changed from the folded state to the other states.

12. The foldable electronic device of claim 1, wherein the instructions, when executed by the at least one processor, cause the foldable electronic device to:
  activate the second front camera, in response to the state of the foldable electronic device being changed from the folded state to the other states, and
  wherein the second preview image displayed on the second display is obtained by the activated second front camera.

13. The foldable electronic device of claim 1, wherein the instructions, when executed by the at least one processor, cause the foldable electronic device to:
  deactivate the first front camera, in response to identifying that the state of the foldable electronic device is changed from the folded state to the other states.

14. The foldable electronic device of claim 1, wherein the second front camera supports a wider field of view range than a field of view range of the first front camera.

15. The foldable electronic device of claim 1, further comprising:
- a first rear camera disposed at a second side, opposite to the first side, of the second housing structure; and
- a second rear camera disposed at the second side of the second housing structure;
- wherein the instructions, when executed by the at least one processor, cause the foldable electronic device to:
  - display, via the first display, a third preview image obtained by the first rear camera while the foldable electronic device is in the folded state;
  - while the third preview image obtained by the first rear camera is displayed on the first display in the folded state, identify that the state of the foldable electronic device is changed from the folded state to the other states, based on the sensor information provided by the sensor; and
  - in response to identifying that the state of the foldable electronic device is changed from the folded state to the other states, activate the second display to display a fourth preview image obtained by the second rear camera.

16. A foldable electronic device comprising:
- a foldable housing including a first housing structure and a second housing structure rotatably coupled to the first housing structure;
- a sensor configured to provide sensor information used to identify a state of the foldable electronic device, wherein the state of the foldable electronic device includes a folded state and other states including an intermediate state and a flat state;
- a first display disposed at a first side of the first housing structure;
- a second display disposed at a second side of the first housing structure and a first side of the second housing structure, wherein the second side is an opposite side of the first side of the first housing structure and the second display is configured to be folded in the folded state;
- a first rear camera disposed at a second side, opposite to the first side, of the second housing structure;
- a second rear camera disposed at the second side of the second housing structure;
- at least one processor; and
- memory storing instructions that, when executed by the at least one processor, cause the foldable electronic device to:
  - display, via the first display, a first preview image obtained by the first rear camera while the foldable electronic device is in the folded state;
  - while the first preview image obtained by the first rear camera is displayed on the first display in the folded state, identify that the state of the foldable electronic device is changed from the folded state to the other states, based on the sensor information provided by the sensor; and
  - in response to identifying that the state of the foldable electronic device is changed from the folded state to the other states, activate the second display to display a second preview image obtained by the second rear camera.

17. The foldable electronic device of claim 16, wherein the second rear camera supports a wider field of view range than a field of view range of the first rear camera.

18. The foldable electronic device of claim 16, wherein the instructions, when executed by the at least one processor, cause the foldable electronic device to:
- activate the second rear camera, in response to identifying the state of the foldable electronic device is changed from the folded state to the other states, and
- wherein the second preview image displayed on the second display is obtained by the activated second rear camera.

19. The foldable electronic device of claim 16, wherein the instructions, when executed by the at least one processor, cause the foldable electronic device to:
- deactivate the first rear camera, in response to identifying that the state of the foldable electronic device is changed from the folded state to the other states.

20. The foldable electronic device of claim 16, wherein the instructions, when executed by the at least one processor, cause the foldable electronic device to:
- display an indicator on the second display to indicate which camera is activated among a first rear camera or a second rear camera, in response to identifying that the state of the foldable electronic device is changed from the folded state to the other states.

* * * * *